(12) United States Patent
Kwon et al.

(10) Patent No.: US 12,218,300 B2
(45) Date of Patent: Feb. 4, 2025

(54) LIGHT EMITTING DIODE DISPLAY DEVICE AND METHOD OF FABRICATING LIGHT EMITTING DIODE DISPLAY DEVICE

(71) Applicant: LG Display Co., Ltd., Seoul (KR)

(72) Inventors: Kyu Oh Kwon, Paju-si (KR); Jae Min Sim, Paju-si (KR); Seung Jun Lee, Paju-si (KR); Jung Hun Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 436 days.

(21) Appl. No.: 17/778,274

(22) PCT Filed: Sep. 2, 2020

(86) PCT No.: PCT/KR2020/011758
§ 371 (c)(1),
(2) Date: May 19, 2022

(87) PCT Pub. No.: WO2021/132841
PCT Pub. Date: Jul. 1, 2021

(65) Prior Publication Data
US 2022/0393088 A1    Dec. 8, 2022

(30) Foreign Application Priority Data
Dec. 24, 2019 (KR) ........................ 10-2019-0174025

(51) Int. Cl.
*H01L 33/62* (2010.01)
*H01L 33/00* (2010.01)
(Continued)

(52) U.S. Cl.
CPC ............ *H01L 33/62* (2013.01); *H01L 33/005* (2013.01); *H01L 33/32* (2013.01); *H01L 33/382* (2013.01);
(Continued)

(58) Field of Classification Search
CPC ..... H01L 33/005; H01L 33/32; H01L 33/382; H01L 2933/0016; H01L 2933/0066
See application file for complete search history.

(56) References Cited

U.S. PATENT DOCUMENTS 7,741,640 B2 * 6/2010 Seo .................. H10K 59/80518
257/40
9,093,407 B2 * 7/2015 Bang ..................... G09G 3/3208
(Continued)

FOREIGN PATENT DOCUMENTS

KR   10-2007-0008995 A   1/2007
KR   10-2016-0007355 A   1/2016
(Continued)

*Primary Examiner* — Monica D Harrison
*Assistant Examiner* — Andre C Stevenson
(74) *Attorney, Agent, or Firm* — Birch, Stewart, Kolasch & Birch, LLP

(57) ABSTRACT

The present disclosure relates to an LED display device, and more particularly, to an LED display device including a repair structure for a deteriorated pixel. In the present disclosure, a subLED electrically connected to first and second connecting electrodes for applying a voltage to a LED is disposed on a deteriorated LED. Thus, deterioration of a display quality due to a deteriorated pixel is prevented. Since it is not required to remove a deteriorated LED, a fabrication cost is reduced and a process efficiency is improved.

15 Claims, 13 Drawing Sheets

(51) Int. Cl.
　　　 *H01L 33/32* 　　　(2010.01)
　　　 *H01L 33/38* 　　　(2010.01)
(52) U.S. Cl.
　　　 CPC ............. *H01L 2933/0016* (2013.01); *H01L 2933/0066* (2013.01)

(56) References Cited

U.S. PATENT DOCUMENTS

2016/0056225 A1\* 2/2016 Lee .................... H10K 59/1213
　　　　　　　　　　　　　　　　　　　　　　　438/23
2019/0206927 A1\* 7/2019 Lee .................... H01L 25/0753

FOREIGN PATENT DOCUMENTS

KR　 10-2017-0115142 A 　10/2017
WO　 WO 2017/160119 A1 　9/2017

\* cited by examiner

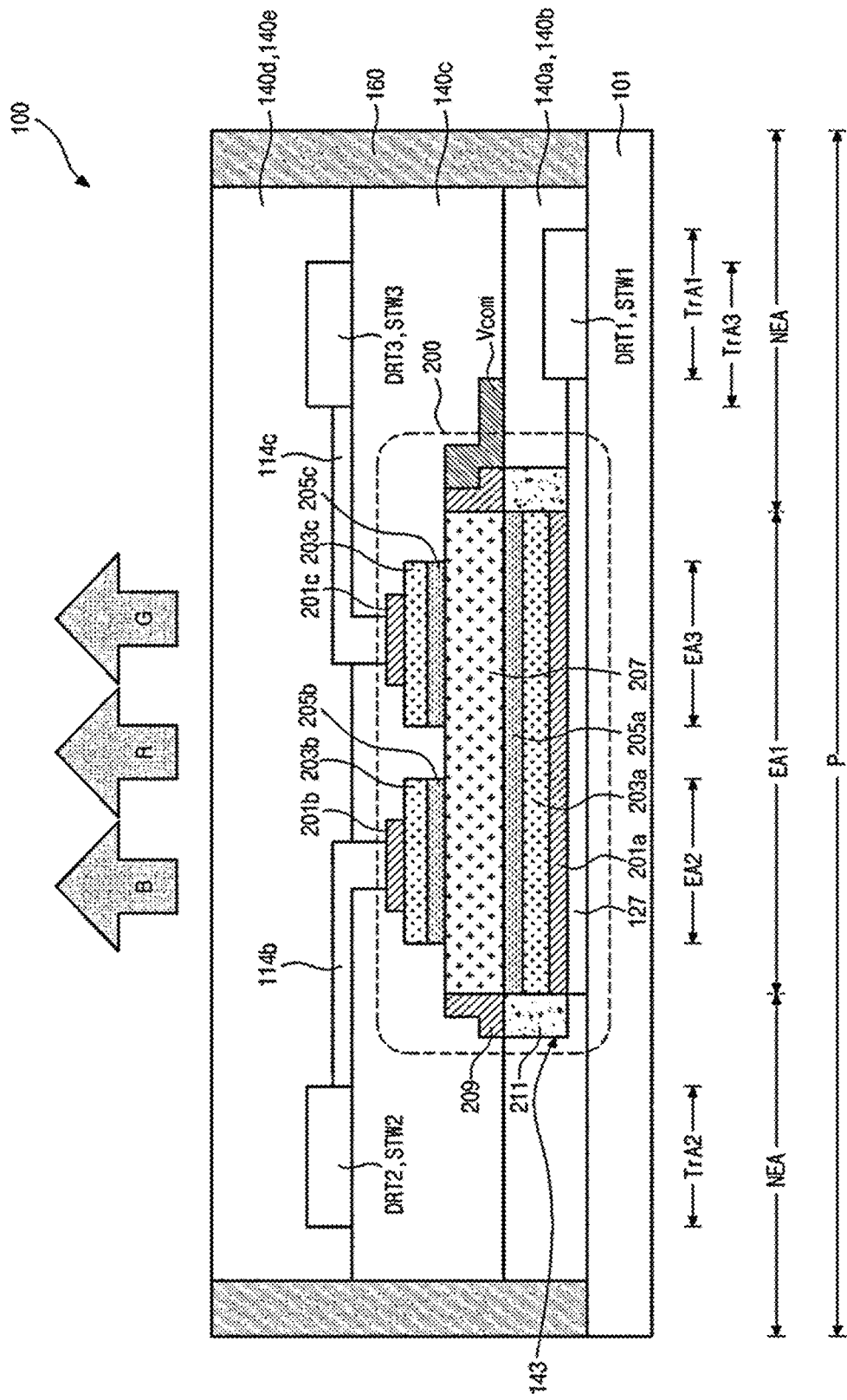

[FIGURE 2]
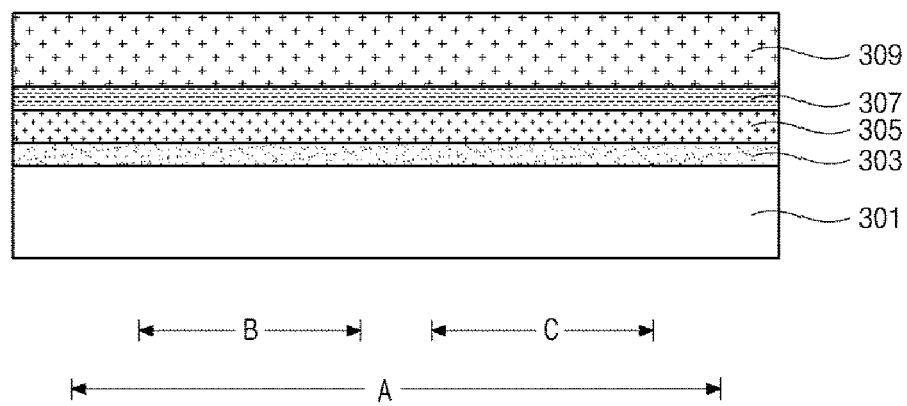
[FIGURE 3]
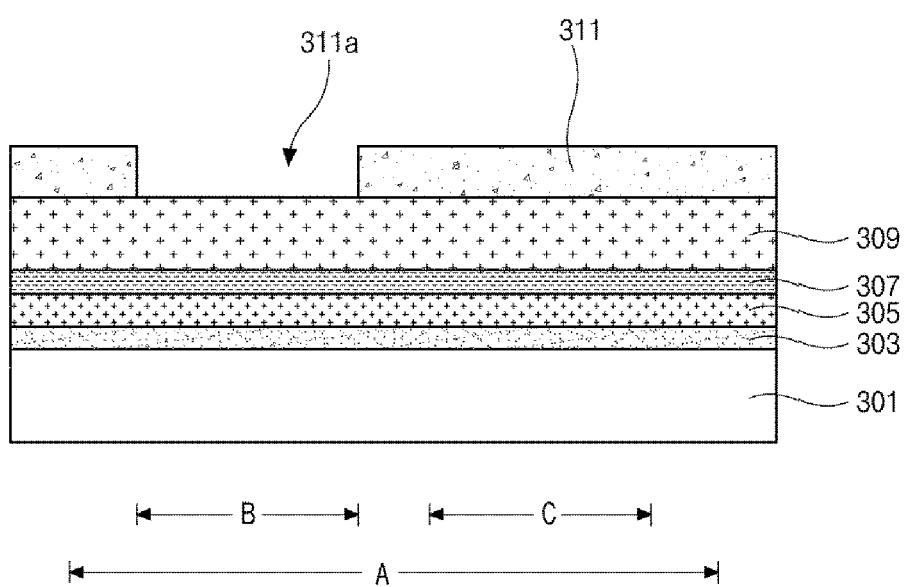

【FIGURE 4】
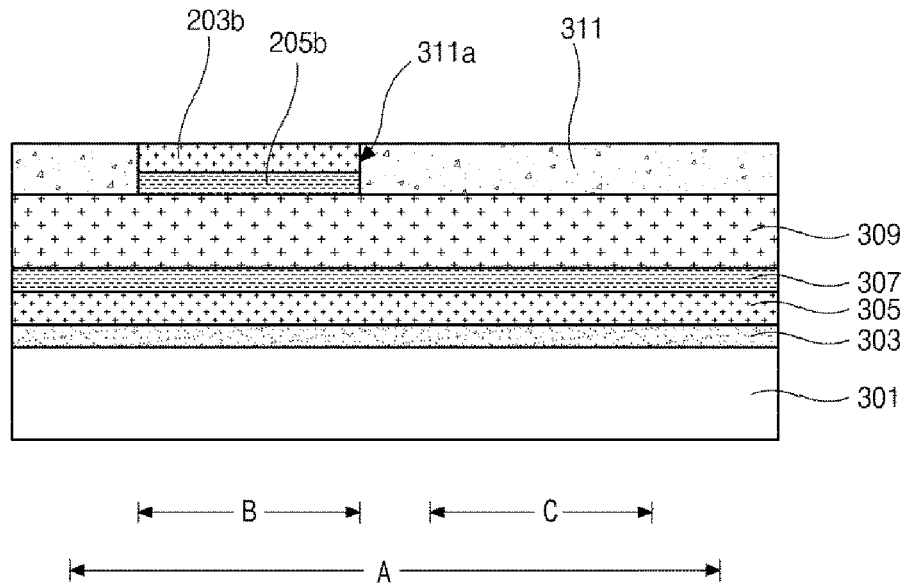
【FIGURE 5】
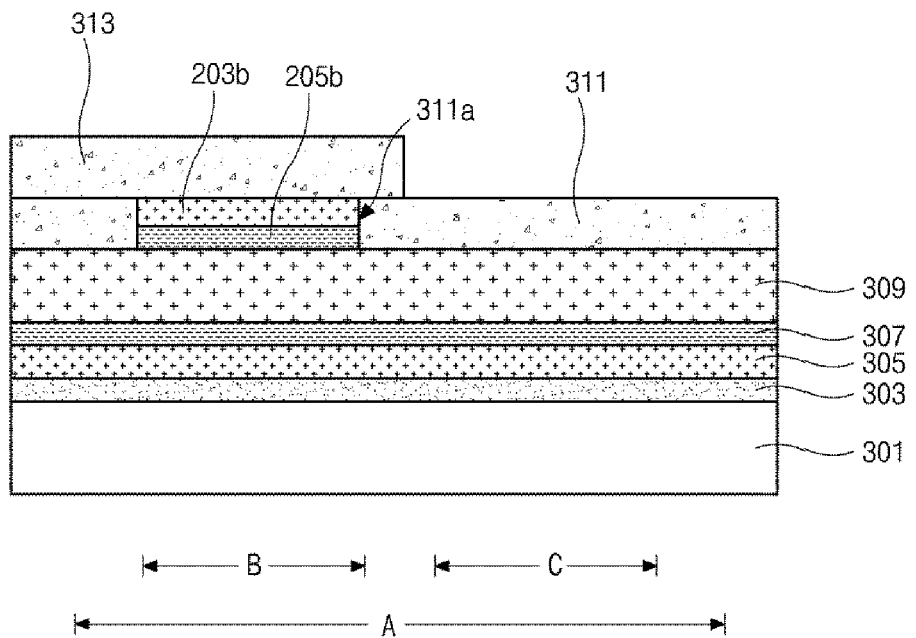

[FIGURE 6]
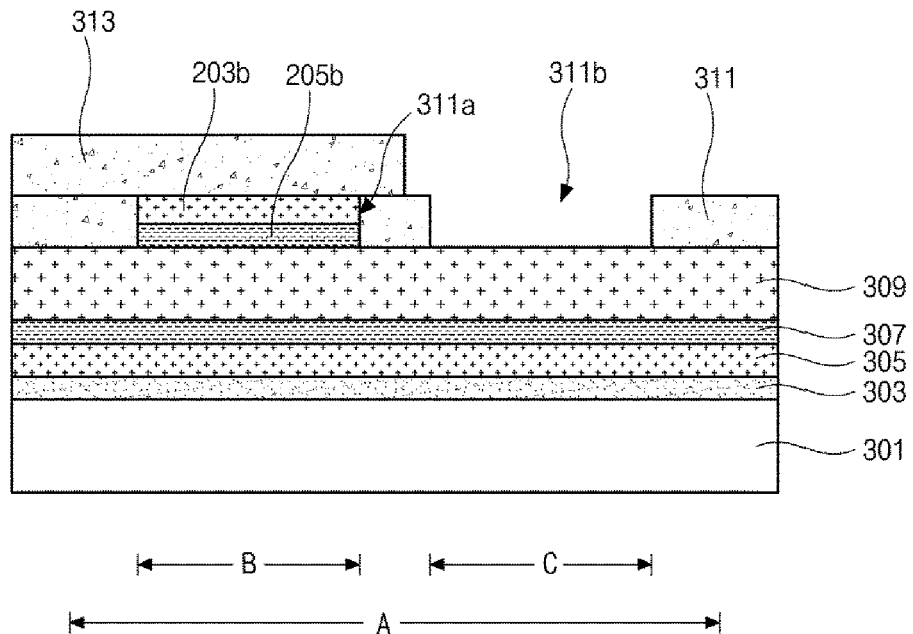
[FIGURE 7]
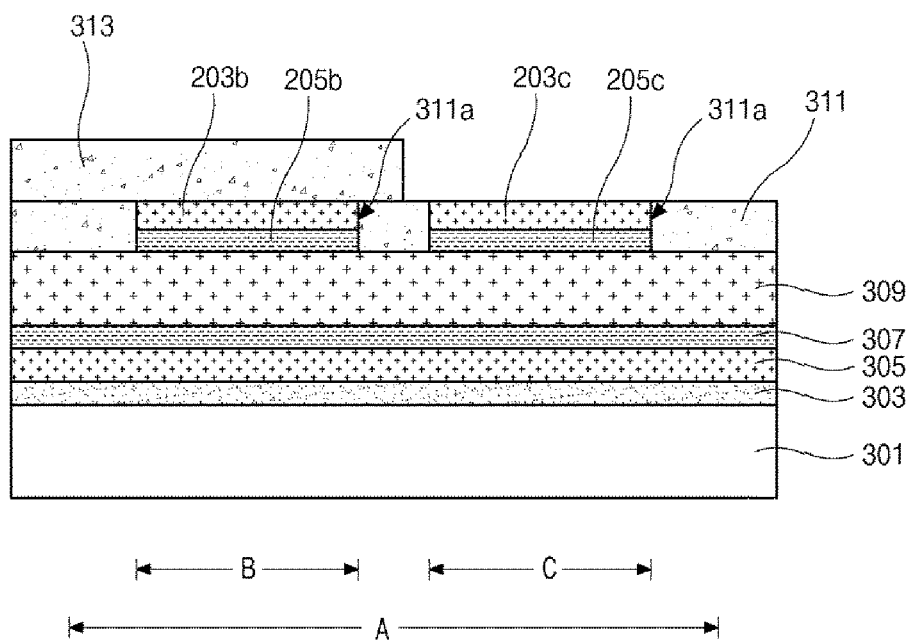

[FIGURE 8]
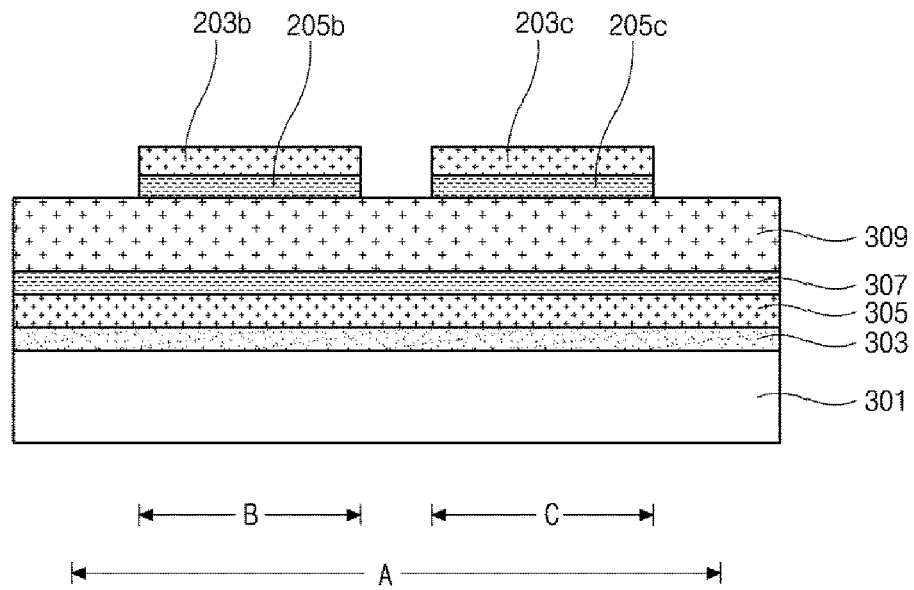
[FIGURE 9]
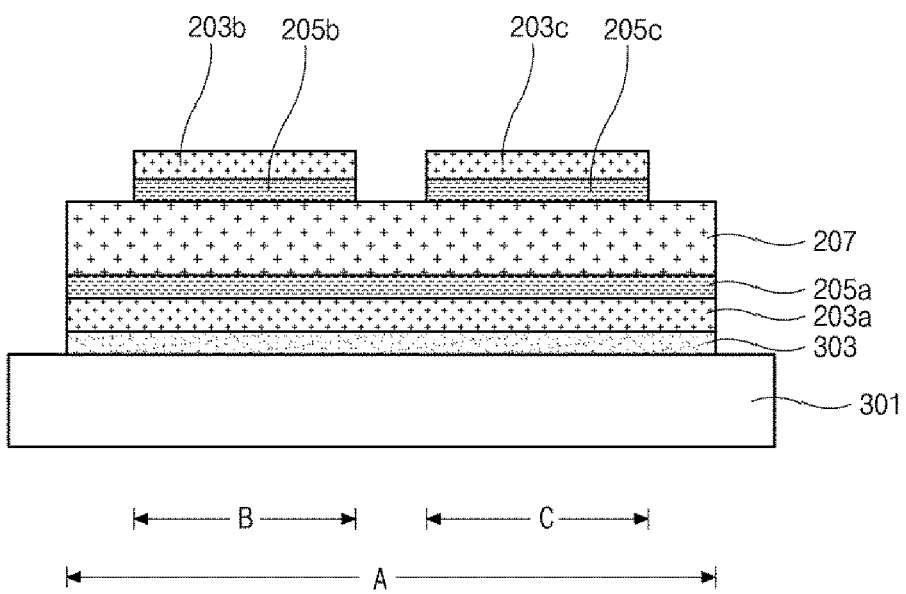

[FIGURE 10]
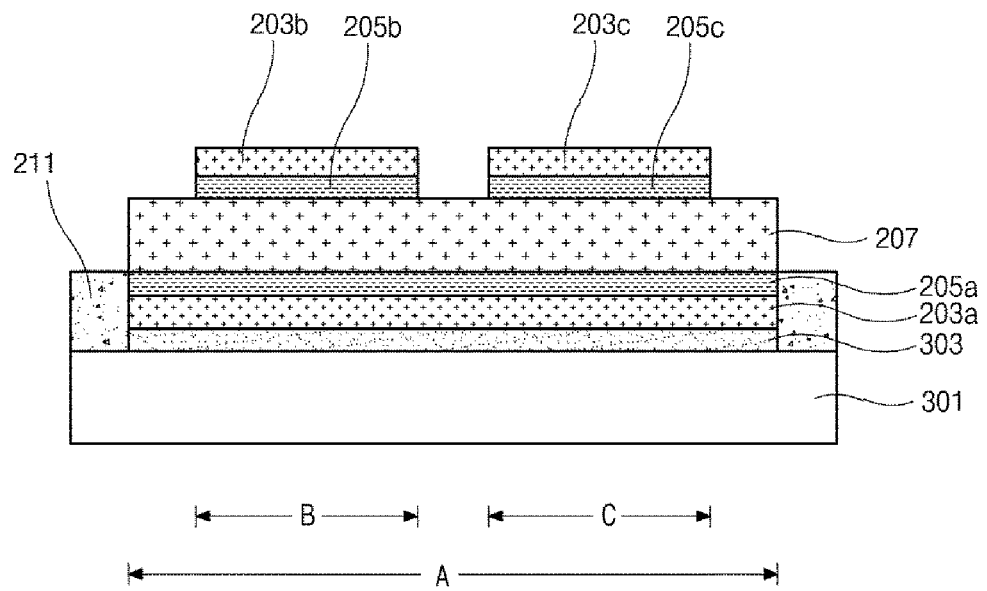
[FIGURE 11]
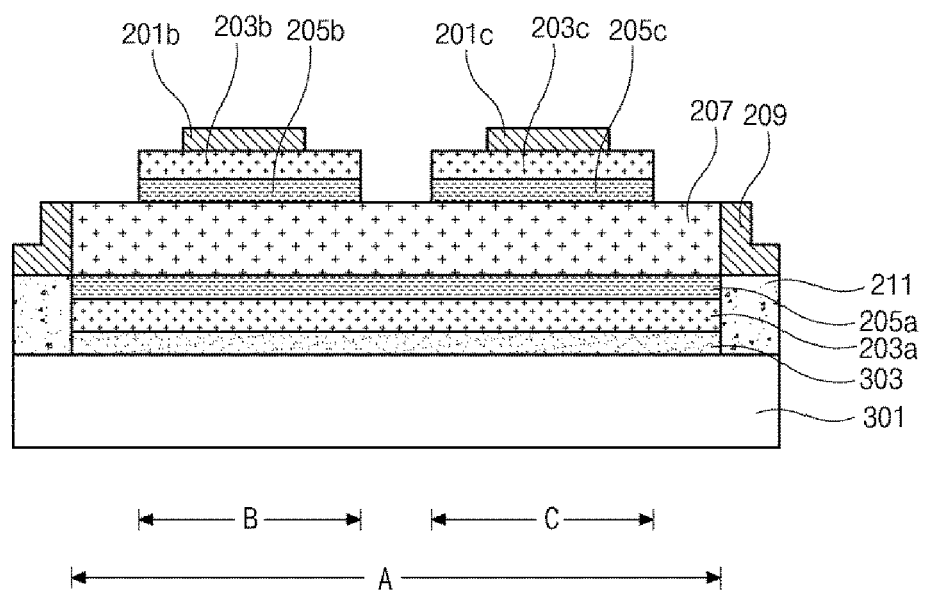

[FIGURE 12]
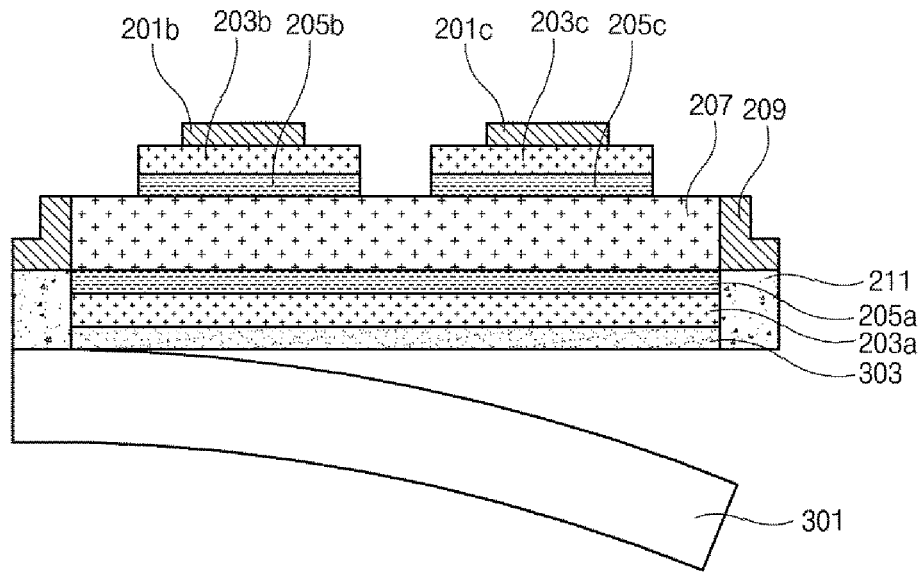
[FIGURE 13]
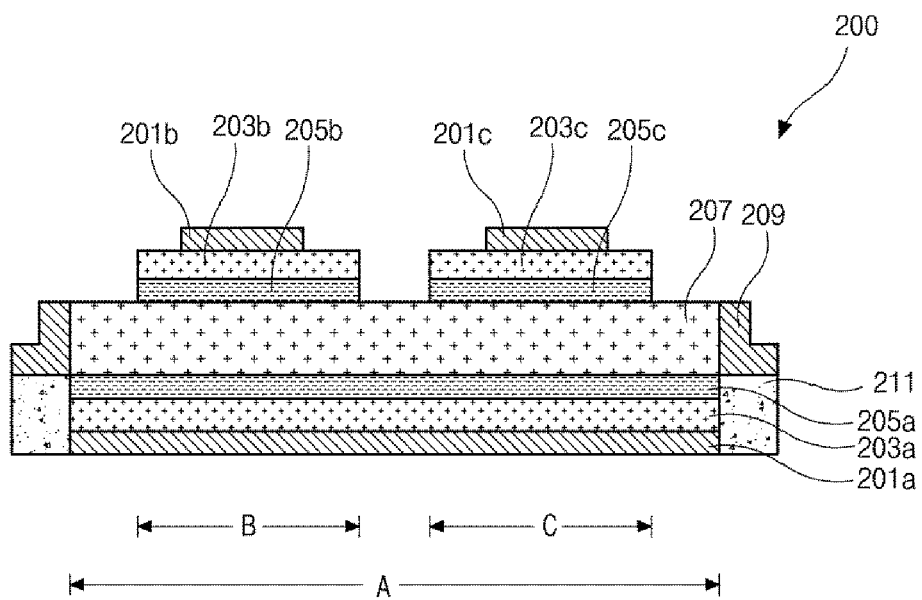

[FIGURE 14]
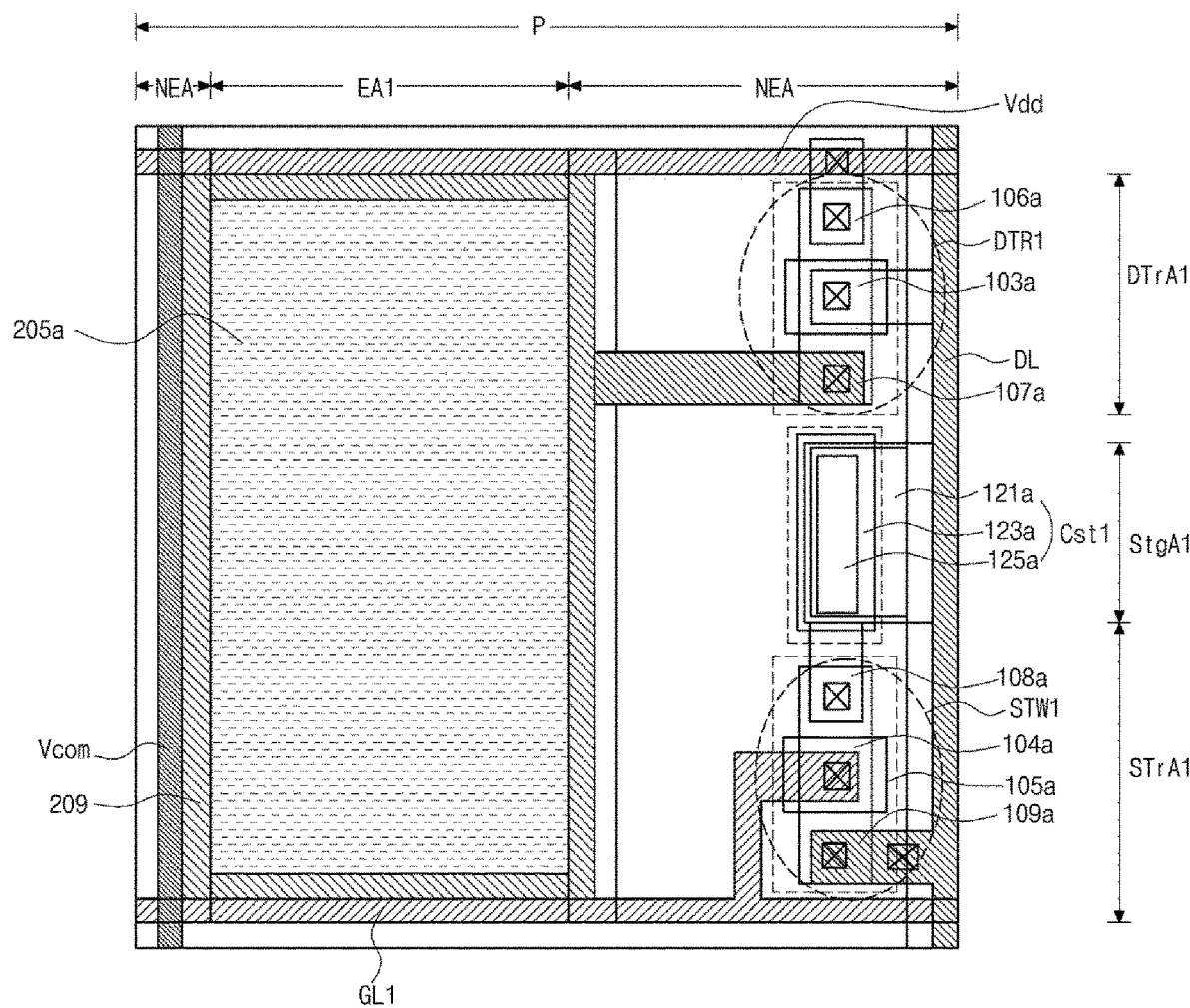

[FIGURE 15]
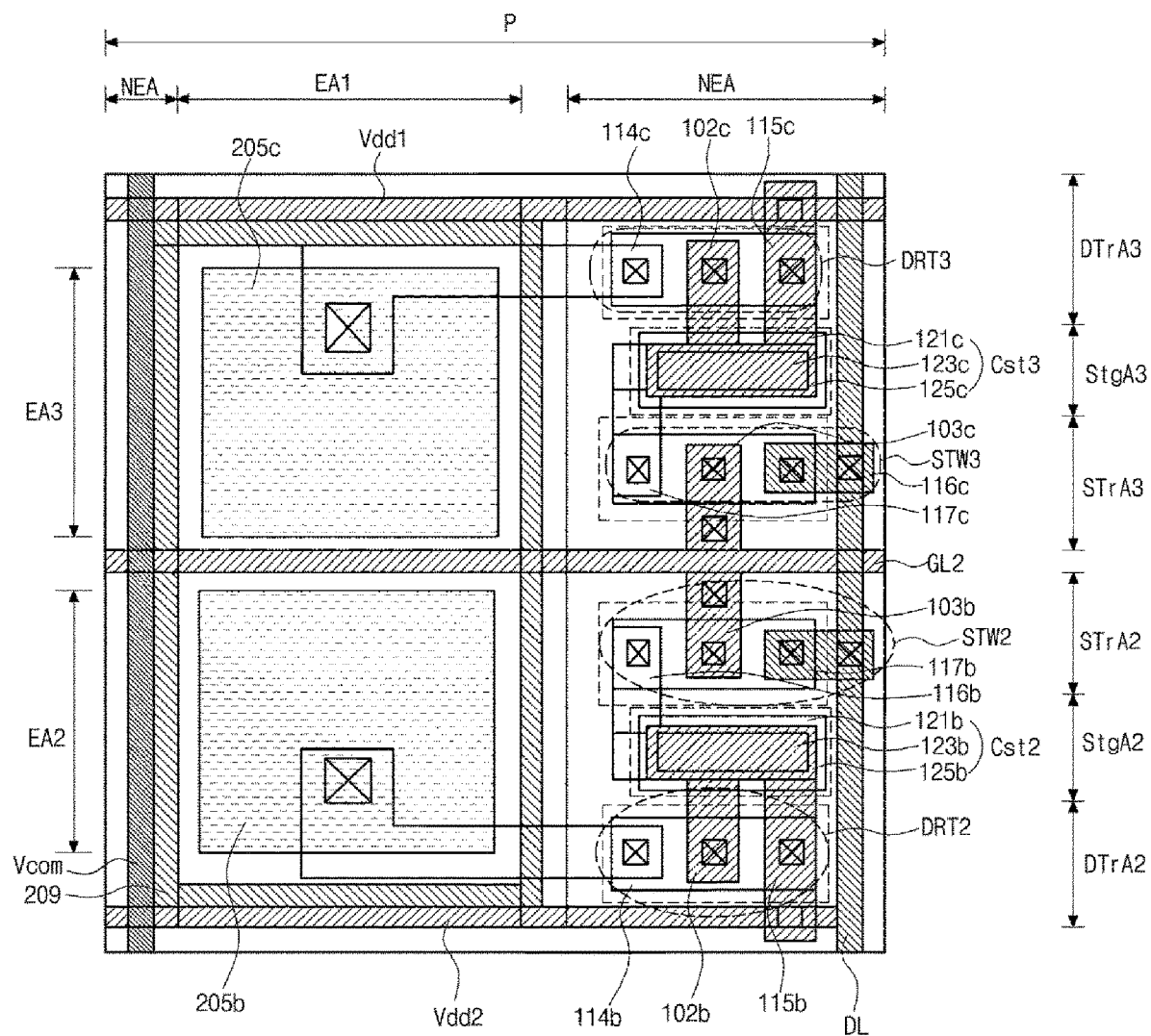

[FIGURE 16]
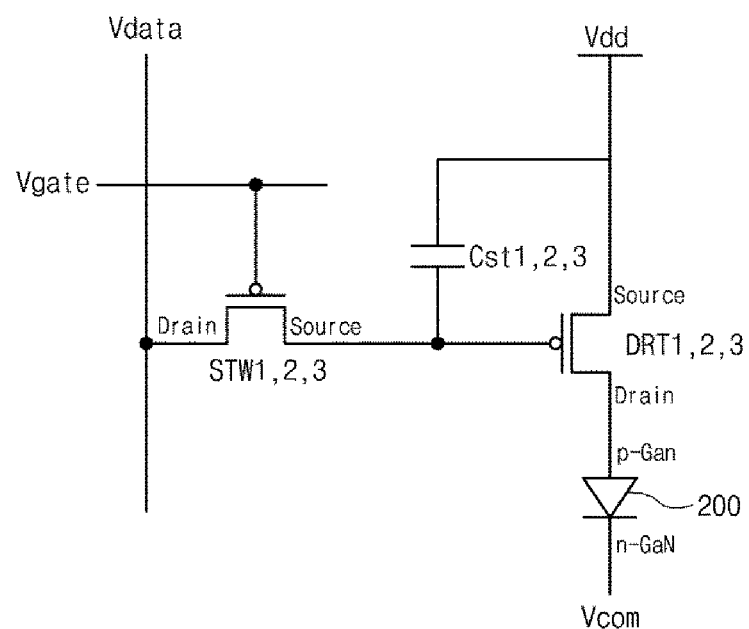

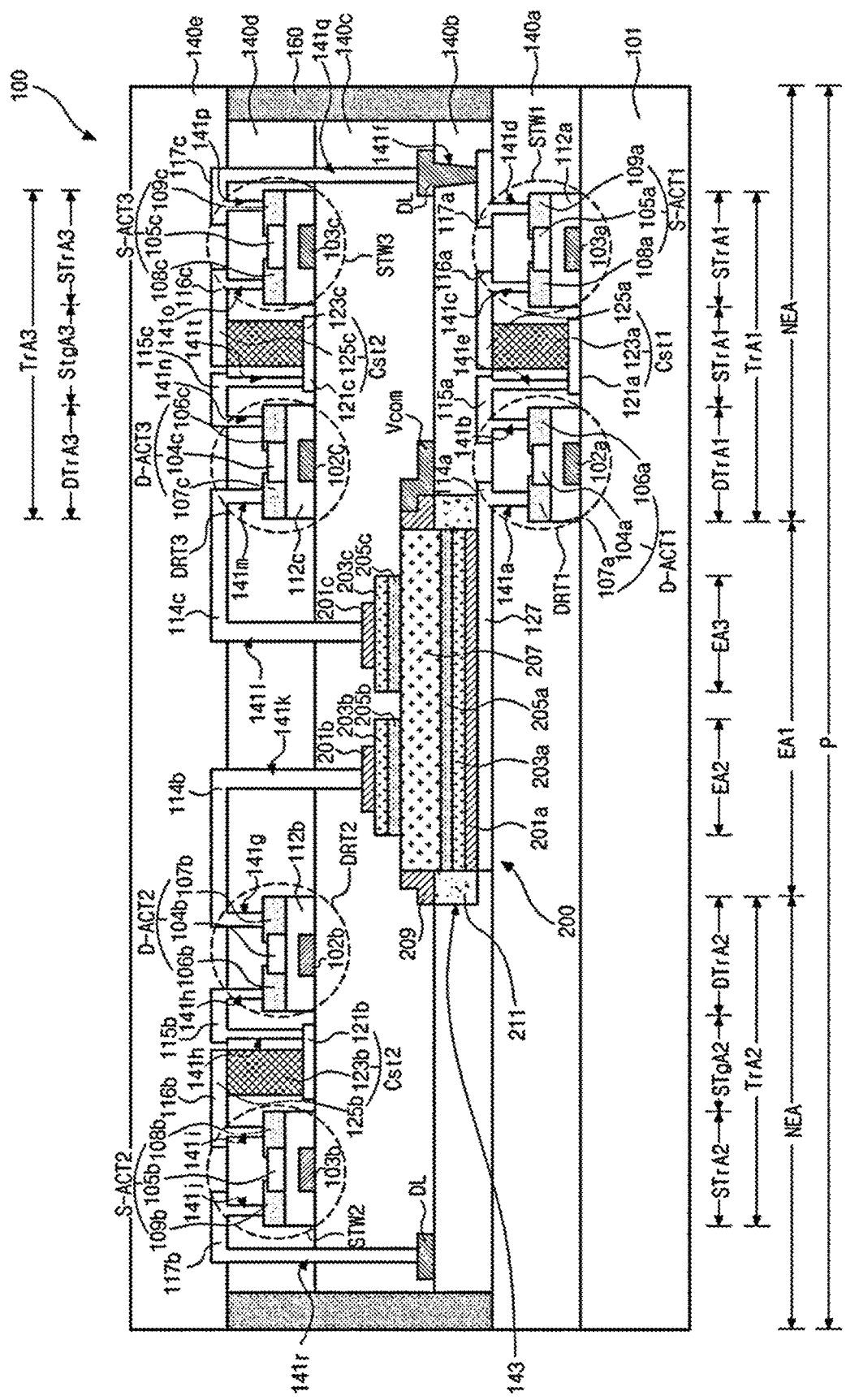
[FIGURE 17]

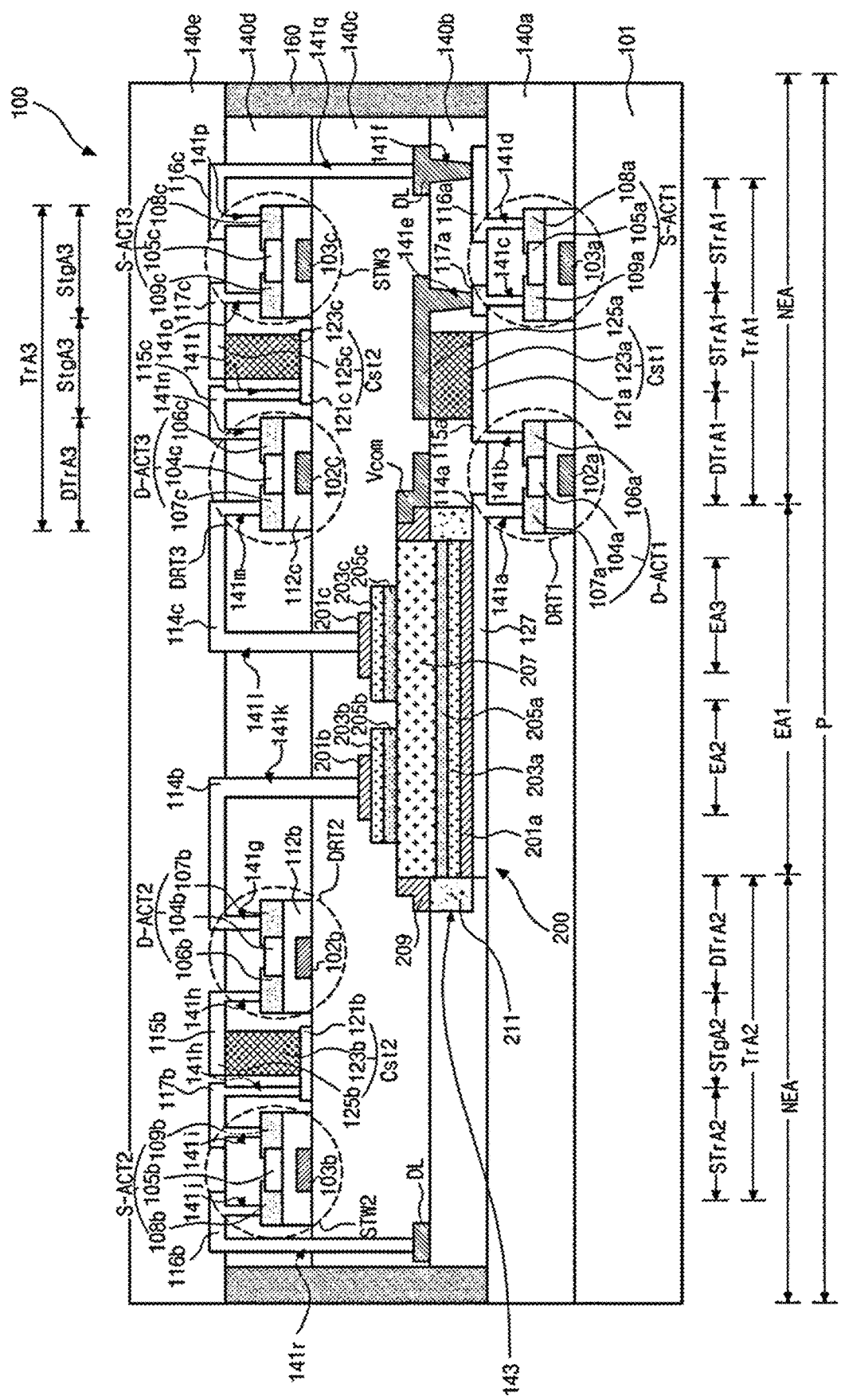
[FIGURE 18]

[FIGURE 19]
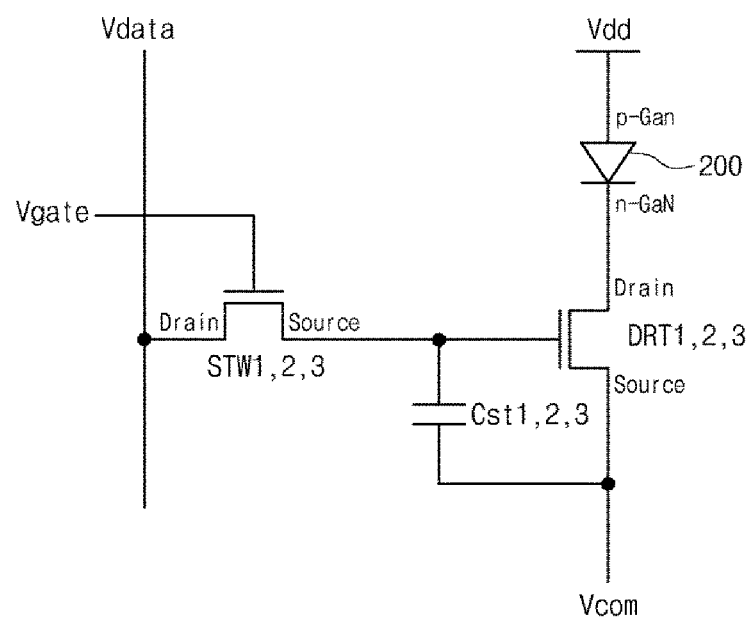

LIGHT EMITTING DIODE DISPLAY DEVICE AND METHOD OF FABRICATING LIGHT EMITTING DIODE DISPLAY DEVICE

CROSS REFERENCE TO RELATED APPLICATIONS

This Application is the National Stage filing under 35 U.S.C. 371 of International Application No. PCT/KR2020/011758, filed on Sep. 2, 2020, which claims priority under 35 U.S.C. § 119(a) to Patent Application No. 10-2019-0174025, filed in the Republic of Korea on Dec. 24, 2019, the entire contents of all these applications being hereby expressly incorporated by reference into the present application.

TECHNICAL FIELD

The present disclosure relates to a light emitting diode display device, and more particularly, to a light emitting diode display device where a high resolution is obtained and an area of an emission area increases.

DISCUSSION OF THE RELATED ART

Recently, requests for flat panel display devices having a small occupied area have been increased according to enlargement of display devices, and a technology of a liquid crystal display (LCD) device or an organic electroluminescent display (OLED) device has been rapidly developed.

Here, in the LCD device, a backlight unit is disposed under a liquid crystal panel having polarizing plates on front and rear surfaces thereof. Therefore, only less than 5% of a light from a light source of the backlight unit passes through the liquid crystal panel, and the LCD device has a disadvantage in an emission efficiency.

Although the OLED device has an improved emission efficiency as compared with the LCD device, the OLED device still has a limit in an emission efficiency and has a disadvantage in a durability and/or a lifetime of the display device.

Thus, to solve the above problems of the LCD device and/or the OLED device, a light emitting diode (LED) display device has been recently suggested.

The LED display device where a mini-LED having a size of several hundreds micrometers or a micro-LED (μLED) having a size of several tens micrometers is disposed in each subpixel for displaying an image has advantages such as a low power consumption and a small size.

In the LED display device, for obtaining a full color of red, green and blue colors, i.e., a multiple color, LEDs emitting red, green and blue colored lights are disposed in the subpixels, respectively, and the subpixels corresponding to red, green and blue colors constitute a single unit pixel.

When a single LED has a minimum size of 10 μm, there is a limit such that the single pixel including three subpixels corresponding to red, green and blue colors has a size greater than 30 μm.

As a result, it is difficult to obtain the LED display device of a high resolution where a pixel density per a unit area increases.

In addition, since the LED emitting the red colored light has a relatively low emission efficiency as compared with the LEDs emitting the green and blue colored lights, it is impossible to obtain a high luminance of the red colored light as compared with the green and blue colored lights.

Although an area of the LED emitting the red colored light is enlarged for improving the emission efficiency of the LED emitting the red colored light, there is a limit due to a high resolution.

Specifically, a substrate for forming the LED emitting the red colored light is different from a substrate for forming the LED emitting the green or blue colored light. For example, the substrate for forming the LED emitting the red colored light may include gallium arsenide (GaAs), and the substrate for forming the LED emitting the green or blue colored light may include sapphire ($Al_2O_3$).

As a result, the LED emitting the red colored light and the LED emitting the green or blue colored light are formed on the substrates, respectively, including different materials.

Further, since a material for an active layer of the LED emitting the red colored light is different from a material for an active layer of the LED emitting the green or blue colored light, a fabrication process becomes complicated and a fabrication cost increases.

DETAILED ILLUSTRATION OF DISCLOSURE

Technical Subject

Accordingly, the present disclosure is directed to a light emitting diode display device that substantially obviates one or more of the problems due to the limitations and disadvantages of the related art. A first object of the present disclosure is to provide a light emitting diode (LED) display device having a high resolution.

A second object of the present disclosure is to provide a micro-LED display device where an emission efficiency is improved by enlarging an emission area of an LED.

A third object of the present disclosure is to provide an LED display device where a fabrication cost is reduced and a fabrication process is simplified.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

Means for Solving Subject

The present disclosure provides an LED display device including: a substrate; an LED including a first semiconductor layer, a first active layer and a second semiconductor layer sequentially disposed and corresponding to a first emission area, a second active layer on the second semiconductor layer and corresponding to a second emission area overlapping a portion of the first emission area, a third semiconductor layer on the second active layer, a third active layer on the second semiconductor layer and corresponding to a third emission area overlapping another portion of the first emission area and a fourth semiconductor layer on the third active layer; a first transistor on a portion of the substrate for driving the first active layer; a second transistor on another portion of the substrate for driving the second active layer; and a third transistor on the first transistor over the portion of the substrate for driving the third active layer.

Here, a first pad electrode is disposed under the first semiconductor layer, third and fourth pad electrodes are disposed on the third and fourth semiconductor layers, respectively, and a second pad electrode is disposed along an edge of the second semiconductor layer and contacts a side surface of the second semiconductor layer. An insulating layer is disposed along an edge of the first pad electrode, the first semiconductor layer and the first active layer.

Further, the first semiconductor layer, the third semiconductor layer and the fourth semiconductor layer include a semiconductor material of a negative type gallium nitride (n-GaN) group, and the second semiconductor layer includes a semiconductor material of a positive type gallium nitride (p-GaN) group. The first semiconductor layer, the third semiconductor layer and the fourth semiconductor layer include a semiconductor material of a positive type gallium nitride (p-GaN) group, and the second semiconductor layer includes a semiconductor material of a negative type gallium nitride (n-GaN) group.

Further, the first active layer is doped with europium (Eu). The first pad electrode is electrically connected to a first driving drain electrode of a first driving transistor of the first transistor, the second pad electrode is electrically connected to a common line, the third pad electrode is electrically connected to a second driving drain electrode of a second driving transistor of the second transistor, and the fourth pad electrode is electrically connected to a third driving drain electrode of a third driving transistor of the third transistor. First to third driving gate electrodes of the first to third driving transistors are electrically connected to first to third switching source electrodes of first to third switching transistors, respectively, the first to third switching gate electrodes of the first to third switching transistors are electrically connected to a gate line, first to third driving source electrodes of the first to third driving transistors are electrically connected to a power line, and first to third switching source electrodes of the first to third switching transistors electrically connected to a data line.

Further, the first pad electrode is electrically connected to a first driving drain electrode of a first driving transistor of the first transistor, the second pad electrode is electrically connected to a power line, the third pad electrode is electrically connected to a second driving drain electrode of a second driving transistor of the second transistor, and the fourth pad electrode is electrically connected to a third driving drain electrode of a third driving transistor of the third transistor. First to third driving gate electrodes of the first to third driving transistors are electrically connected to first to third switching drain electrodes of first to third switching transistors, respectively, the first to third switching gate electrodes of the first to third switching transistors are electrically connected to a gate line, first to third driving source electrodes of the first to third driving transistors are electrically connected to a common line, and first to third switching source electrodes of the first to third switching transistors electrically connected to a data line.

Further, the first to third driving transistors include the first to third driving gate electrodes, first to third driving anti-insulating patterns, first to third driving active layers having first to third driving source and drain regions and first to third driving source and drain electrodes, and the first to third switching transistors include the first to third switching gate electrodes, first to third switching anti-insulating patterns, first to third switching active layers having first to third switching source and drain regions and first to third switching source and drain electrodes.

In addition, the present disclosure provides a method of fabricating an LED display device including: a) sequentially forming an undoped semiconductor layer, a first semiconductor material layer, an active material layer and a second semiconductor material layer on a growth substrate; b) forming a first insulating layer having a first concave portion on the second semiconductor material layer; c) sequentially forming a second active layer and a third semiconductor layer in the first concave portion on the second semiconductor material layer; d) after forming a second concave portion in the first insulating layer, sequentially forming a second active layer and a third semiconductor layer in the second concave portion on the second semiconductor material layer; e) forming a first semiconductor layer, a first active layer and a second semiconductor layer by patterning the first semiconductor material layer, the active material layer and the second semiconductor material layer; f) forming an insulating layer along an edge of the first semiconductor layer and the first active layer; g) forming a second pad electrode along an edge of the second semiconductor layer, a third pad electrode on the third semiconductor layer and a fourth pad electrode on the fourth semiconductor layer over the insulating layer; h) removing the growth substrate and the undoped semiconductor layer; and i) forming aa first pad electrode under the first semiconductor layer.

Here, the step of d) comprises forming a second insulating layer on the third semiconductor layer, and the method further includes, before the step of c), removing the first insulating layer.

Effect of Disclosure

In an LED display device according to the present disclosure, a first emission area and a second emission area are disposed to overlap each other, and the first emission area and a third emission area are disposed to overlap each other. An LED including a first active layer is disposed to correspond to the first emission area, a second active layer of the LED is disposed to correspond to a second emission area, and a third active layer of the LED is disposed to correspond to a third emission area. A first switching transistor and a first driving transistor for driving the first active layer are disposed in a first transistor area, a second switching transistor and a second driving transistor for driving the second active layer are disposed in a second transistor area, and a third switching transistor and a third driving transistor for driving the third active layer are disposed in the third transistor area. Since red, green and blue colors are obtained in a single pixel, a size of a pixel decreases and a pixel density per a unit area increases as compared with a pixel including red, green and blue subpixels. As a result, a high resolution greater than 300 ppi (pixel per inch) and an ultra-high resolution greater than 500 ppi are obtained.

In addition, since areas of the first to third active layers are enlarged, an emission efficiency of each active layer is improved and an image of a high luminance is obtained.

Further, since a transfer process of the LED is omitted, a fabrication time and a fabrication cost are reduced, and a fabrication efficiency is improved. Moreover, since the first to third active layer are formed on a same substrate through an epitaxial growth, a fabrication cost is reduced and a fabrication process is simplified. As a result, a reliability of a product is improved.

DESCRIPTION OF DRAWINGS

FIG. 1 is a schematic cross-sectional view showing a pixel of a light emitting diode display device according to an embodiment of the present disclosure.

FIGS. 2 to 13 are schematic cross-sectional view showing a method of fabricating a light emitting diode according to a first embodiment of the present disclosure.

FIG. 14 is a schematic plan view showing a first emission area and a first transistor area of a pixel of a light emitting diode display device according to a first embodiment of the present disclosure.

FIG. 15 is a schematic plan view showing second and third emission areas and second and third transistor areas according to a first embodiment of the present disclosure.

FIG. 16 is a schematic circuit diagram showing a circuit structure of a light emitting diode display device according to a first embodiment of the present disclosure.

FIG. 17 is a schematic cross-section view showing a pixel of a light emitting diode display device according to a first embodiment of the present disclosure.

FIG. 18 is a schematic cross-sectional view showing a pixel of a light emitting diode display device according to a second embodiment of the present disclosure.

FIG. 19 is a schematic circuit diagram showing a circuit structure of a light emitting diode display device according to a second embodiment of the present disclosure.

DETAILED DESCRIPTION

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary. In construing an element, the element is construed as including an error or tolerance range even where no explicit description of such an error or tolerance range.

In describing a position relationship, when a position relation between two parts is described as, for example, "on," "over," "under," or "next," one or more other parts may be disposed between the two parts unless a more limiting term, such as "just" or "direct(ly)," is used. What a device or a layer is designated by "on" another device or another layer includes a case where another layer or another device is interposed directly on or in a middle of another device. When an element is described as "connected to," "combined with" or "contact" another element, it would be understood that an element may be directly connected to or combined with another element, that another element may be "interposed" between elements, or that elements may "be connected to," "be combined with" or "contact" each other through another element.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

A size and a thickness of each element in drawings are shown for convenience of illustration, and the present disclosure is not limited to the size and the thickness of the illustrated element. Hereinafter, various embodiments of the present disclosure will be described in detail with reference to the accompanying drawings.

FIG. 1 is a schematic cross-sectional view showing a pixel of a light emitting diode display device according to an embodiment of the present disclosure.

As shown, a pixel P is defined on a substrate 101. The pixel P includes first to third emission areas EA1, EA and EA3 where an image is substantially displayed, and a non-emission area NEA is disposed along an edge of the first emission area EA1.

A light shielding pattern 160 is disposed along an edge of the pixel P. The light shielding pattern 160 is disposed at a border of the pixel P to prevent a mixture of lights emitted from the adjacent pixels.

Although the light shielding pattern 160 may include a material for a black matrix or a reflective material, it is not limited thereto.

The pixel P includes the first to third emission areas EA1, EA2 and EA3 corresponding to first to third active layers 205a, 205b and 205c, respectively, and the non-emissive area NEA is disposed along the edge of the first emission area EA1.

First to third transistor areas TrA1, TrA2 and TrA3 where first to third transistors DRT1, DRT2, DRT3, STW1, STW2 and STW3 electrically connected to the first to third active layers 205a, 205b and 205c, respectively, are disposed are defined in the non-emission area NEA.

The first to third emission areas EA1, EA2 and EA3 are defined on the substrate 101 to overlap each other. The first emission area EA1 and the second emission area EA2 are defined to overlap each other, and the first emission area EA1 and the third emission area EA3 are defined to overlap each other.

The second emission area EA2 and the third emission area EA3 do not overlap each other.

A light emitting diode (ELD) 200 is disposed in the first emission area EA1 and includes first to fourth semiconductor layers 203a, 207, 203b and 203c and the first to third active layers 205a, 205b and 205c.

The first transistors DRT1 and STW1 are disposed in the first transistor area TrA1 of the non-emission area NEA on the substrate 101, and first and second interlayer insulating layers 140a and 140b are disposed on a whole of the substrate 101 having the first transistors DRT1 and STW1.

A concave portion 143 is disposed in the second interlayer insulating layer 140b to correspond to the first emission area EA1, and the LED 200 is disposed in the concave portion 143.

The LED 200 includes the first semiconductor layer 203a, the first active layer 205a and the second semiconductor layer 207 sequentially laminated. The second active layer 205b and the third semiconductor layer 203b are sequentially laminated on a portion of the second semiconductor layer 207, and the third active layer 205c and the fourth semiconductor layer 203c are laminated on the other portion of the second semiconductor layer 207.

The first semiconductor layer 203a, the third semiconductor layer 203b and the fourth semiconductor layer 203c provide an electron to the first to third active layers 205a, 205b and 205c, respectively. The first semiconductor layer 203a, the third semiconductor layer 203b and the fourth semiconductor layer 203c may include a semiconductor material of a positive type gallium nitride (p-GaN) group, and the semiconductor material of a p-GaN group may include gallium nitride (GaN), aluminum gallium nitride (AlGaN), indium gallium nitride (InGaN) or aluminum indium gallium nitride (AlInGaN). Magnesium (Mg), zinc (Zn) or beryllium (Be) may be used as an impurity for doping the first semiconductor layer 203a, the third semiconductor layer 203b and the fourth semiconductor layer 203c.

The first to third active layers 205a, 205b and 205c adjacent to the first semiconductor layer 203a, the third semiconductor layer 203b and the fourth semiconductor layer 203c may have a multi quantum well (MQW) structure including a well layer and a barrier layer having a band gap greater than the well layer.

The first active layer 205a emits a red colored light, the second active layer 205b emits a blue colored light, and the third active layer 205c emits a green colored light.

The first to third active layers 205a, 205b and 205c may have an MQW structure of indium gallium nitride (InGaN)/gallium nitride (GaN), and the first active layer 205a may be doped with europium (Eu).

As a result, the first active layer 205a may include III-V group or II-VI group doped with europium (Eu). For example, the first active layer 205a may include a compound semiconductor material such as gallium nitride (GaN), indium gallium nitride (InGaN), aluminum gallium nitride (AlGaN) and indium aluminum gallium nitride (InAlGaN) doped with europium (Eu).

Europium (Eu) doped to the first active layer 205a has an ion state. As a result, an electron and a hole injected from the first semiconductor layer 203a and the second semiconductor layer 207 are recombined with each other in the first active layer 205a and transitions in europium ($Eu^{3+}$) such that the first active layer 205a emits a red colored light (590 nm to 670 nm).

Each of the second active layer 205b emitting a blue colored light and the third active layer 205c emitting a green colored light may include a compound semiconductor material such as gallium nitride (GaN), indium gallium nitride (InGaN), aluminum gallium nitride (AlGaN) and indium aluminum gallium nitride (InAlGaN) doped with indium (In). The second and third active layers 205b and 205c may have different doping concentrations.

As an indium concentration increases, a wavelength of a light emitted from the second and third active layers 205b and 205c moves from a short wavelength to a long wavelength. As a result, the third active layer 205c having a relatively high indium concentration may emit a green colored light (490 nm to 560 nm), and the second active layer 205b having a relatively low indium concentration may emit a blue colored light (440 nm to 480 nm).

The indium concentration doped to the second and third active layers 205b and 205c may be easily adjusted, and a color purity of blue and green colors may be adjusted by changing the indium concentration.

The second semiconductor layer 207 provides a hole to the first to third active layers 205a, 205b and 205c. The second semiconductor layer 207 may include a semiconductor material of a negative type gallium nitride (n-GaN) group, and the semiconductor material of a negative type gallium nitride (n-GaN) group may include gallium nitride (GaN), aluminum gallium nitride (AlGaN), indium gallium nitride (InGaN) or aluminum indium gallium nitride (AlInGaN). Silicon (Si), germanium (Ge), selenium (Se), tellurium (Te) or carbon (C) may be used as an impurity for doping the second semiconductor layer 207.

A first pad electrode 201a is disposed under the first semiconductor layer 203a of the LED 200, and a first connecting electrode 127 is disposed under the first pad electrode 201a. The first connecting electrode 127 is electrically connected to the first transistors DRT1 and STW1 in the first transistor area TrA1 defined in a portion of the non-emission area NEA, and the first pad electrode 201a is electrically connected to the first transistors DRT1 and STW1.

The second semiconductor layer 207 on the first active layer 205a is disposed to be exposed over the second interlayer insulating layer 140b, and a second pad electrode 209 is disposed along an edge of the second semiconductor layer 207 on the second interlayer insulating layer 140b.

The second pad electrode 209 contacts a side surface of the second semiconductor layer 207.

An insulating layer 211 is disposed along an edge of the first semiconductor layer 203a, the first active layer 205a and the first pad electrode 201a to insulate the first pad electrode 201a, the first active layer 205a and the first semiconductor layer 203a from the second pad electrode 209.

The second pad electrode 209 is electrically connected to a common line Vcom on the second interlayer insulating layer 140b.

Third and fourth pad electrodes 201b and 201c are disposed on the third and fourth semiconductor layers 203b and 203c, respectively, and a third interlayer insulating layer 140c is disposed on a whole of the substrate 101 having the third and fourth pad electrodes 201b and 201c, the second pad electrode 209 and the common line Vcom.

The second transistors DRT2 and STW2 are disposed in the second transistor area TrA2 of the non-emission area NEA on a portion of the third interlayer insulating layer 140c, and the third transistors DRT3 and STW3 are disposed in the third transistor area TrA3 of the non-emission area NEA on the other portion of the third interlayer insulating layer 140c.

The second transistors DRT2 and STW2 are electrically connected to the third pad electrode 201b through a second driving drain electrode 114b, and the third transistors DRT3 and STW3 are electrically connected to the fourth pad electrode 201c through a third driving drain electrode 114c.

The third and fourth pad electrodes 201b and 201c and the second and third driving drain electrodes 114b and 114c may include a transparent conductive oxide material such as indium tin oxide (ITO), indium zinc oxide (IZO), indium tin zinc oxide (ITZO), zinc oxide (ZnO) and tin oxide (TO) having a relatively high transmittance.

Fourth and fifth interlayer insulating layers 140d and 140e are disposed on a whole of the substrate 101 having the second and third transistors DRT2, STW2, DRT3 and STW3 to protect the second and third transistors DRT2, STW2, DRT3 and STW3 and the LED 200 from an exterior oxide and an exterior moisture.

In the LED display device 100 according to an embodiment of the present disclosure, since the first to third transistors DRT1, STW1, DRT2, STW2, DRT3 and STW3 and the LED 200 including the first to third active layers 205a, 205b and 205c are disposed in the single pixel P, the single pixel P displays each of the red, green and blue colors or mixture of at least two of the red, green and blue colors.

The first to third active layers 205a, 205b and 205c are electrically connected to the first to third transistors DRT1, STW1, DRT2, STW2, DRT3 and STW3, respectively, and may be individually driven by the first to third transistors DRT1, STW1, DRT2, STW2, DRT3 and STW3.

As a result, only the third active layer 205c may emit a light through the third transistors DRT3 and STW3 so that the pixel P can emit only the green colored light. Alternatively, both the second and third active layers 205b and 205c may emit a light through the second and third transistors DRT2, STW2, DRT3 and STW3 so that the pixel P can emit both the blue and green colored lights.

Further, only the first active layer 205a may emit a light through the first transistors DRT1 and STW1. Since the second and third active layers 205b and 205c include a nitride semiconductor material having a relatively high transmittance and the third and fourth pad electrodes 201b and 201c include a transparent conductive oxide material having a high transmittance, the red colored light emitted from the first active layer 205a passes through the second and third active layers 205b and 205c and the third and fourth pad electrodes 201b and 201c so that the pixel P can emit a red colored light.

In the LED display device 100 according to an embodiment of the present disclosure, since the single pixel P may display the red, green and blue colors, a size of the single unit pixel P is reduced as compared with a unit pixel including red, green and blue subpixels.

As a result, the pixel density per unit area increases, and both of a high resolution greater than 300 ppi (pixel per inch) and an ultra-high resolution greater than 500 ppi are obtained.

Further, since an area of the first to third active layers 205a, 205b and 205c is enlarged, an emission efficiency of each of the first to third active layers 205a, 205b and 205c is improved and an image of a relatively high luminance is obtained.

A following TABLE 1 shows a comparison result of sizes of the active layers 205a, 205b and 205c and the pixel P of an LED display device according to a comparison example and an LED display device according to an embodiment of the present disclosure. Sample 1 represents an LED display device according to a comparison example, and Sample 2 represents an LED display device 100 according to an embodiment of the present disclosure.

TABLE 1

| classification | | Sample 1 | Sample 2 |
| --- | --- | --- | --- |
| pixel size | R subpixel | 40 × 55.5 μm(100%) | 84 × 148 μm(560%) |
| | G subpixel | 40 × 55.5 μm(100%) | 64 × 58 μm(167%) |
| | B subpixel | 40 × 55.5 μm(100%) | 64 × 58 μm(167%) |
| active layer size | R active layer | 34 × 34.5 μm(100%) | 84 × 148 μm(1060%) |
| | G active layer | 34 × 34.5 μm(100%) | 64 × 58 μm(316%) |
| | B active layer | 34 × 34.5 μm(100%) | 64 × 58 μm(316%) |

In Sample 1 and Sample 2, for the pixel having the same area, the transistors DRT1, STW1, DRT2, STW2, DRT3 and STW3 and the storage capacitors Cst1, Cst2 and Cst3 have the same area as each other. In TABLE 1, the LED display device of Sample 1 includes R, G and B subpixels each having a size of 40×55.5 μm, and the size of the single subpixel may be defined as 100%. In the LED display device 100 according to an embodiment of the present disclosure, since each of R, G and B subpixels has a minimum size of 64×58 μm, the size of the single subpixel increases by 167% to 560% as compared with the size of the subpixel of the LED display device according to the comparison example. Further, Sample 1 includes R, G and B active layers each having a maximum size of 34×34.5 μm, and the size of the single active layer may be defined as 100%. In the LED display device 100 according to an embodiment of the present disclosure of Sample 2, the size of the first to third active layers 205a, 205b and 205c increases by a minimum of 316% to a maximum of 1060%.

In the LED display device 100 according to an embodiment of the present disclosure, the first active layer 205a emitting a red colored light in the first emission area EA1 may have a size increasing by 1060% as compared with the R active layer of the LED display device according to a comparison example, and the second and third active layers 205b and 205c may have a size increasing by 316% as compared with the G and B active layers of the LED display device according to a comparison example.

Since the size of each of the first to third active layers 205a, 205b and 205c increases, the emission efficiency of each of the first to third active layers 205a, 205b and 205c is improved and a relatively high luminance is obtained.

FIGS. 2 to 13 are schematic cross-sectional views showing a method of fabricating a light emitting diode according to an embodiment of the present disclosure.

In FIG. 2, a first region A corresponding to the first emission area EA1 (of FIG. 1), a second region B overlapping the first region A and corresponding to the second emission area EA2 (of FIG. 1) and a third region C overlapping the first region A and corresponding to third emission area EA3 (of FIG. 1) are defined in a growth substrate 301. An undoped semiconductor layer 315, a first semiconductor material layer 303, an active material layer 305 and a second semiconductor material layer 307 are sequentially formed on the growth substrate 301.

The growth substrate 301 may be a sapphire ($Al_2O_3$) substrate, a silicon carbide substrate or a silicon substrate where the semiconductor material layers 303 and 307, specifically nitride of II group, have a state of epitaxial growth. Preferably, the growth substrate 301 may be a sapphire substrate.

The undoped semiconductor layer 315 may include micro-gallium nitride (μ-GaN) undoped with an impurity.

The undoped semiconductor layer 315 may be referred to as a buffer layer and may be grown on the growth substrate 301 to alleviate a mismatch of a lattice and a difference of a thermal expansion coefficient.

Each of the first and second semiconductor material layers 303 and 307 and the active material layer 305 may include a nitride semiconductor material.

The first semiconductor material layer 303 may include a semiconductor material of a positive type gallium nitride (p-GaN) group, and the semiconductor material of a p-GaN group may include gallium nitride (GaN), aluminum gallium nitride (AlGaN), indium gallium nitride (InGaN) or aluminum indium gallium nitride (AlInGaN). Magnesium (Mg), zinc (Zn) or beryllium (Be) may be used as an impurity for doping the first semiconductor material layer 303.

The second semiconductor material layer 307 may include a semiconductor material of a negative type gallium nitride (n-GaN) group, and the semiconductor material of a n-GaN group may include gallium nitride (GaN), aluminum gallium nitride (AlGaN), indium gallium nitride (InGaN) or aluminum indium gallium nitride (AlInGaN). Silicon (Si), germanium (Ge), selenium (Se), tellurium (Te) or carbon (C) may be used as an impurity for doping the second semiconductor material layer 307.

The active material layer 305 may include III-V group or II-VI group doped with europium (Eu). For example, the active material layer 305 may include a compound semiconductor material such as gallium nitride (GaN), indium gallium nitride (InGaN), aluminum gallium nitride (AlGaN) and indium aluminum gallium nitride (InAlGaN) doped with europium (Eu).

The undoped semiconductor layer 305, the first and second semiconductor material layers 303 and 307 and the active material layer 305 may be formed on the growth substrate 301 through an epitaxial growth to have an excellent crystallinity.

Although the undoped semiconductor layer 305, the first and second semiconductor material layers 303 and 307 and the active material layer 305 may be formed on the growth substrate 301 through a metal organic chemical vapor deposition (MOCVD) method, it is not limited thereto. For example, the undoped semiconductor layer 305, the first and second semiconductor material layers 303 and 307 and the active material layer 305 may be formed through a molecular beam epitaxy (MBE) method, a plasma enhanced chemical vapor deposition (PECVD) method or a vapor phase epitaxy (VPE) method. The MOCVD method may be performed at a temperature of about 900° C. to about 1300° C.

In FIG. 3, after a first insulating layer 311 is entirely deposited on the second semiconductor material layer 307, a first concave portion 311a is formed to correspond to the second region B.

In FIG. 4, a second active layer 205b and a third semiconductor material layer 203b are sequentially formed in the first concave portion 311a.

In FIG. 5, a second insulating layer 313 is formed on the third semiconductor material layer 203b. In FIG. 6, a second concave portion 311b is formed in the first insulating layer 311 to correspond to the third region C.

In FIG. 7, a third active layer 205c and a fourth semiconductor material layer 203c are sequentially formed in the second concave portion 311b.

The second and third active layers 205b and 205c may have an MQW structure of indium gallium nitride (InGaN)/gallium nitride (GaN), and each of the second and third active layers 205b and 205c may include a compound semiconductor material such as gallium nitride (GaN), indium gallium nitride (InGaN), aluminum gallium nitride (AlGaN) and indium aluminum gallium nitride (InAlGaN) doped with indium (In) of a different concentration.

The third and fourth semiconductor material layers 203b and 203c may include a semiconductor material of a positive type gallium nitride (p-GaN) group, and the semiconductor material of a p-GaN group may include gallium nitride (GaN), aluminum gallium nitride (AlGaN), indium gallium nitride (InGaN) or aluminum indium gallium nitride (AlInGaN). Magnesium (Mg), zinc (Zn) or beryllium (Be) may be used as an impurity for doping the third and fourth semiconductor material layers 203b and 203c.

The first and second concave portions 311a and 311b may be formed through an etching process using a mask.

In FIG. 8, the first and second insulating layers 311 and 313 are removed through an etching method such as a wet etching. In FIG. 9, the first semiconductor layer 203a, the first active layer 205a and the second semiconductor layer 207 are formed by patterning the first semiconductor material layer 303, the active material layer 305 and the second semiconductor material layer 307 to correspond to the first region A.

The patterning may be performed through an etching process using a mask.

In FIG. 10, the insulating layer 211 is formed along the edge of the first semiconductor layer 203a and the first active layer 205a.

In FIG. 11, the second pad electrode 209 is formed on the insulating layer 211 along the edge of the second semiconductor layer 207 to contact a side surface of the second semiconductor layer 207, and the third and fourth pad electrodes 201b and 201c are formed on the third semiconductor layer 203b and the fourth semiconductor layer 203c.

The second pad electrode 209 may include indium tin oxide (ITO), indium zinc oxide (IZO) or zinc oxide (ZnO). Alternatively, the second pad electrode 209 may include silver (Ag), aluminum (Al), gold (Au), chromium (Cr), iridium (Ir), magnesium (Mg), neodymium (Nd), nickel (Ni), palladium (Pd), platinum (Pt), rhodium (Rh), titanium (Ti) or tungsten (W) having a relatively high reflectance, or an alloy of at least two thereof, or a laminated structure of different metals.

The third and fourth pad electrodes 201b and 201c may include a transparent conductive oxide material such as indium tin oxide (ITO), indium zinc oxide (IZO), indium tin zinc oxide (ITZO), zinc oxide (ZnO) and tin oxide (TO).

In FIG. 12, the growth substrate 301 may be removed through a laser lift-off (LLO) process. In the LLO process, a heat energy is focused on a border surface of the growth substrate 301 and the undoped semiconductor layer 315 on the growth substrate 301 by focusing and irradiating an excimer laser beam on the growth substrate 301.

As a result, an interface of the growth substrate 301 and the undoped semiconductor layer 315 is divided into gallium and nitrogen molecules, and the growth substrate 301 is instantaneously divided from the undoped semiconductor layer 315 at a portion where the excimer laser beam passes.

In FIG. 13, after the undoped semiconductor layer 315 is removed, the first pad electrode 201a is formed under the first semiconductor layer 203a. As a result, the LED 200 according to an embodiment of the present disclosure is completed.

After the completed LED 200 is transferred to the substrate 101 (of FIG. 1) having transistors DRT1, STW1, DRT2, STW2, DRT3 and STW3 (of FIG. 1), the LED 200 is electrically connected to the transistors DRT1, STW1, DRT2, STW2, DRT3 and STW3 on the substrate 101. As a result, the LED display device 100 (of FIG. 1) of the present disclosure is completed.

Although the transferring process of the LED is performed three times per unit pixel in the LED display device according to a comparison example, the transferring process of the LED may be performed once per unit pixel P (of FIG. 1) in the LED display device 100 according to an embodiment of the present disclosure. As a result, a fabrication time and a fabrication cost are reduced, and a fabrication efficiency is improved.

Specifically, in the LED display device 100 according to an embodiment of the present disclosure, since the first active layer 205a emitting a red colored light is formed on the growth substrate 301 together with the second and third active layers 205b and 205c through an epitaxial growth, a fabrication cost is reduced and a fabrication process is simplified.

In the LED display device according to a comparison example, the LED emitting a red colored light is formed on a growth substrate including gallium arsenide (GaAs). The active layer emitting a red colored light includes a material such as gallium phosphide (GaP), and the active layer emitting a green colored light and a blue colored light includes a compound semiconductor material such as gallium nitride (GaN), indium gallium nitride (InGaN), aluminum gallium nitride (AlGaN) and indium aluminum gallium nitride (InAlGaN) doped with indium (In).

As a result, the LED emitting a red colored light and the LED emitting a green colored light and a blue colored light are not formed on the same growth substrate through the same process, and a fabrication cost increases and a fabrication process becomes complicated.

In the LED display device 100 according to an embodiment of the present disclosure, since the active layer 205a emitting a red colored light includes gallium nitride (GaN) doped with europium (Eu), the first active layer 205a emitting a red colored light is formed on the growth substrate 301 (of FIG. 12) of sapphire together with the second and third active layers 205b and 205c emitting blue and green colored lights.

As a result, a fabrication cost is reduced and a fabrication process is simplified.

Specifically, since all the first to third active layers 205a, 205b and 205c are formed of a compound semiconductor material such as gallium nitride (GaN), indium gallium nitride (InGaN), aluminum gallium nitride (AlGaN) and indium aluminum gallium nitride (InAlGaN), the first to third active layers 205a, 205b and 205c are formed through the same fabrication process, and conditions of injecting a current for driving the active layers 205a, 205b and 205c are the same as each other. As a result, a reliability of product is also improved.

Further, in the LED display device according to a comparison example, since the growth substrate of gallium arsenide (GaAs) for the active layer emitting a red colored light is opaque an additional technology of dividing the growth substrate is required. In the LED display device according to an embodiment of the present disclosure, since the growth substrate 301 of sapphire is transparent, the growth substrate may be easily divided through a laser lift-off (LLO) method. As a result, a fabrication time and a fabrication cost are reduced, and a fabrication efficiency is improved.

In the LED display device 100 according to an embodiment of the present disclosure, since red, green and blue colors are obtained in the single pixel P, a size of the pixel is reduced as compared with the LED display device where the red, green and blue subpixels separated from each other are required.

Since a density of a pixel P per unit area increases, a high resolution greater than 300 ppi (pixel per inch) and an ultra-high resolution greater than 500 ppi are obtained.

In addition, since areas of the first to third active layers 205a, 205b and 205c are enlarged, an emission efficiency of each of the active layers 205a, 205b and 205c is improved, and an image of a relatively high luminance is obtained.

Further, since a transferring process of the LED 200 is omitted, a fabrication time and a fabrication cost are reduced and a fabrication efficiency is improved. Since the first to third active layers 205a, 205b and 205c are formed on the same growth substrate 301 through an epitaxial growth, a fabrication cost is reduced, a fabrication process is simplified and a reliability of a product is improved.

Hereinafter, a connection structure of the first to third active layers 205a, 205b and 205c and the first to third transistors DRT1, STW1, DRT2, STW2, DRT3 and STW3 in the LED display device 100 will be illustrated according to embodiments.

First Embodiment

FIG. 14 is a schematic plan view showing a first emission area and a first transistor area in a pixel of a light emitting diode display device according to a first embodiment of the present disclosure, and FIG. 15 is a schematic plan view showing second and third emission areas and second and third transistor areas in a pixel of a light emitting diode display device according to a first embodiment of the present disclosure.

FIG. 16 is a schematic circuit diagram showing a circuit structure of a light emitting diode display device according to a first embodiment of the present disclosure.

Here, a front surface is defined as one surface where a light is emitted from a pixel P, and a rear surface is defined as the other surface opposite to the front surface.

In FIG. 14, when a rear surface of the light emitting diode (LED) display device 100 (of FIG. 1) according to a first embodiment of the present disclosure is viewed, a first gate line GL1 and a data line DL are disposed along an edge of a single unit pixel P, the common line Vcom is disposed to face into the data line DL, and a first power line Vdd1 is disposed to face into the first gate line GL1.

Although the single unit pixel P is defined by a crossing structure of the data line DL and the first gate line GL1, it is not limited thereto.

The pixel P includes the first emission area EA1 where an image is substantially displayed, and the non-emission area NEA is disposed along an edge of the first emission area EA1.

The light emitting diode (LED) 200 (of FIG. 13) is disposed in the first emission area EA1, and the first transistors DRT1 and STW1 are disposed in the first transistor area TrA1 of the non-emission area NEA at one side of the first emission area EA1.

When the pixel P is viewed from the rear surface, only the first active layer 205a is disposed in the first emission area EA1, and a red colored light is emitted from the first active layer 205a in the first emission area EA1 to the front surface.

The first and second semiconductor layers 203a and 207 (of FIG. 13) and the first active layer 205a between the first and second semiconductor layers 203a and 207 are laminated and disposed in the first emission area EA1. The first pad electrode 201a (of FIG. 13) is disposed under the first semiconductor 203a, and the second pad electrode 209 is disposed along an edge of the first active layer 205a.

The first transistors DRT1 and STW1 connected to the first gate line GL1, the data line DL, the common line Vcom and the first power line Vdd1 are disposed in the first transistor area TrA1 of the non-emission area NEA. The first switching transistor STW1 is disposed in a region where the first gate line GL1 and the data line DL cross each other, and the first driving transistor DRT1 is disposed between the first switching transistor STW1 and the first power line Vdd1.

The first switching transistor STW1 selects each pixel P and includes a first switching gate electrode 103a, a first switching active layer S-ACT1 (of FIG. 17) and first switching source and drain electrodes 116a and 117a.

The first driving transistor DRT1 drives the LED 200 of the pixel P selected by the first switching transistor STW1. The first driving transistor DRT1 includes a first driving gate electrode 102a, a first driving active layer D-ACT1 (of FIG. 17) and first and second driving source and drain electrodes 114a and 115b.

A first-first storage electrode 121a connected to the first driving source electrode 115b of the first driving transistor DRT1 and a first-second storage electrode 125a connected to the first switching source electrode 116a of the first switching transistor STW1 overlap each other with a first dielectric layer 123a interposed therebetween to constitute a first storage capacitor Cst1.

The first storage capacitor Cst1 stores a data voltage Vdata to maintain the same state of the first active layer 205a till a next gate voltage Vgate is applied.

The first driving gate electrode 102a of the first driving transistor DRT1 is connected to the first switching source electrode 116a of the first switching transistor STW1.

The first switching gate electrode 103a of the first switching transistor STW1 is connected to the first gate line GL1, the first driving source electrode 115a of the first driving transistor DRT1 is connected to the first power line Vdd1, and the first switching drain electrode 117a of the first switching transistor STW1 is connected to the data line DL.

The first pad electrode 201a (of FIG. 13) in the first emission area EA1 is connected to the first driving drain electrode 114a of the first driving transistor DRT1, and the second pad electrode 209 is connected to the common line Vcom.

As a result, the first switching transistor STW1 is switched according to the gate voltage Vgate supplied to the first gate line GL1 to supply the data voltage Vdata supplied to the data line DL to the first driving transistor DRT1.

The first driving transistor DRT1 is switched according to the data voltage Vdata supplied from the first switching transistor STW1 to adjust a data current flowing from a power voltage supplied through the first pad electrode 201a of the LED 200 to the first active layer 205a.

The first storage capacitor Cst1 is connected between the first driving gate electrode 102a and the first driving source electrode 115a of the first driving transistor DRT1 to store a voltage corresponding to the data voltage Vdata supplied to the first driving gate electrode 102a of the first driving transistor DRT1 and to turn on the first driving transistor DRT1 with the stored voltage.

As a result, the first active layer 205a is electrically connected between the power voltage supplied through the first pad electrode 201a and the common voltage supplied through the second pad electrode 209 and emits a light due to the data voltage Vdata supplied from the first driving transistor DRT1.

In FIG. 15, when the pixel P is viewed from the front surface, the data line DL and the common line Vcom are disposed along an edge of the single pixel P to face into each other, and the first and second power lines Vdd1 and Vdd2 are disposed perpendicular to the data line DL and the common line Vcom and facing into each other.

A second gate line GL2 is disposed to cross a central portion of the pixel P.

The pixel P overlaps the first emission area EA1 to include the second and third emission areas EA2 and EA3, and the non-emission area NEA is disposed along an edge of the second and third emission areas EA2 and EA3.

The second active layer 205b, the third semiconductor layer 203b and the third pad electrode 201b of the LED 200 are disposed in the second emission area EA2, and the second transistors DRT2 and STW2 are disposed in the second transistor area TrA2 of the non-emission area NEA at one side of the second emission area EA2.

The third active layer 205c, the fourth semiconductor layer 203c and the fourth pad electrode 201c of the LED 200 are disposed in the third emission area EA3, and the third transistors DRT3 and STW3 are disposed in the third transistor area TrA3 of the non-emission area NEA at one side of the third emission area EA3.

When the pixel P is viewed from the front surface, a blue colored light is emitted in the second emission area EA2 due to the second active layer 205b, and a green colored light is emitted in the third emission area EA3 due to the third active layer 205c.

The second transistors DRT2 and STW2 connected to the second gate line GL2, the data line DL, the common line Vcom and the first power line Vdd1 are disposed in the second transistor area TrA2 of the non-emission area NEA. The second switching transistor STW2 is disposed in a region where the second gate line GL2 and the data line DL cross each other, and the second driving transistor DRT2 is disposed between the second switching transistor STW2 and the first power line Vdd1.

The third transistors DRT3 and STW3 connected to the second gate line GL2, the data line DL, the common line Vcom and the second power line Vdd2 are disposed in the third transistor area TrA3. The third switching transistor STW3 is disposed in a region where the second gate line GL2 and the data line DL cross each other, and the third driving transistor DRT3 is disposed between the third switching transistor STW3 and the second power line Vdd2.

The second and third switching transistors STW2 and STW3 select each pixel P and include second and third switching gate electrodes 103b and 103c, second and third switching active layers S-ACT2 and S-ACT3 (of FIG. 17) and second and third switching source and drain electrodes 116b, 116c, 117b and 117c.

The second and third driving transistors DRT2 and DRT3 drive the LED 200 of the pixel P selected by the second and third switching transistors STW2 and STW3. The second and third driving transistors DRT2 and DRT3 include second and third driving gate electrodes 102b and 102c, second and third driving active layers D-ACT2 and D-ACT3 (of FIG. 17) and second and third driving source and drain electrodes 114b, 114c, 115b and 115c.

Second-first and third-first storage electrodes 121b and 121c connected to the second and third driving source electrodes 115b and 115c of the second and third driving transistors DRT2 and DRT3 and second-second and third-second storage electrodes 125b and 125c connected to the second and third switching source electrodes 116b and 116c of the second and third switching transistors STW2 and STW3 overlap each other with second and third dielectric layers 123b and 123c interposed therebetween to constitute second and third storage capacitors Cst2 and Cst3.

The second and third driving gate electrodes 102b and 102c of the second and third driving transistors DRT2 and DRT3 are connected to the second and third switching source electrodes 116b and 116c of the second and third switching transistors STW2 and STW3, respectively.

The second and third switching gate electrodes 103b and 103c of the second and third switching transistors STW2 and STW3 are connected to the second gate line GL2, and the second and third driving source electrodes 115b and 115c of the second and third driving transistors DRT2 and DRT3 are connected to the first and second power lines Vdd1 and Vdd2, respectively.

The second and third switching drain electrodes 117b and 117c of the second and third switching transistors STW2 and STW3 are connected to the data line DL.

The third pad electrode 201b (of FIG. 13) in the second emission area EA2 is connected to the second driving drain electrode 114b of the second driving transistor DRT2, and the fourth pad electrode 201c (of FIG. 13) in the third emission area EA3 is connected to the third driving drain electrode 114c of the third driving transistor DRT3.

As a result, the second and third switching transistors STW2 and STW3 are switched according to the gate voltage Vgate supplied to the second gate line GL2 to supply the data voltage Vdata supplied to the data line DL to the second and third driving transistors DRT2 and DRT3.

The second and third driving transistors DRT2 and DRT3 are switched according to the data voltage Vdata supplied from the second and third switching transistors STW2 and STW3 to adjust a data current flowing from a power voltage supplied through the third and fourth pad electrodes 201b and 201c of the LED 200 (of FIG. 13) to the second and third active layers 205b and 205c.

As a result, the second and third active layers 205b and 205c are electrically connected between the power voltage supplied through the third and fourth pad electrodes 201b and 201c and the common voltage supplied through the second pad electrode 209 and emit a light due to the data current supplied from the second and third driving transistors DRT2 and DRT3.

In the LED display device 100 according to a first embodiment of the present disclosure, when the pixel P is viewed from the front and rear surfaces, the emission areas EA1, EA2 and EA3 are defined differently from each other. When the pixel P is viewed from the rear surface, the first emission area EA1 and the first transistor area TrA1 at one side of the first emission area EA1 are defined. When the pixel P is viewed from the front surface, the second and third emission areas EA2 and EA3 and the second and third transistor areas TrA2 and TrA3 at one side of the second and third emission areas EA2 and EA3 are defined.

As a result, the first emission area EA1 and the second and third emission areas EA2 and EA3 are defined to overlap each other. The first transistor area TrA1 and the second and third transistor areas TrA2 and TrA3 are defined to overlap each other.

In the LED display device 100 according to a first embodiment of the present disclosure, the LED 200 including the first active layer 205a is disposed to correspond to the first emission area EA1, only the second active layer 205b of the LED 200 is disposed to correspond to the second emission area EA2, and only the third active layer 205c of the LED 200 is disposed to correspond to the third emission area EA3. The first switching and driving transistors STW1 and DRT1 for driving the first active layer 205a are disposed in the first transistor area TrA1, the second switching and driving transistors STW2 and DRT2 for driving the second active layer 205b are disposed in the second transistor area TrA2, and the third switching and driving transistors STW3 and DRT3 for driving the third active layer 205c are disposed in the third transistor area TrA3.

Since all of red, green and blue colors are obtained in the single pixel P due to the first to third active layers 205a, 205b and 205c, a size of the pixel is reduced as compared with the LED display device according to a comparison example.

Since a density of a pixel P per unit area increases, a high resolution greater than 300 ppi (pixel per inch) and an ultra-high resolution greater than 500 ppi are obtained.

In addition, since areas of the first to third active layers 205a, 205b and 205c are enlarged, an emission efficiency of each of the active layers 205a, 205b and 205c is improved, and an image of a relatively high luminance is obtained.

Further, since a transferring process of the LED 200 is omitted, a fabrication time and a fabrication cost are reduced and a fabrication efficiency is improved. Since the first to third active layers 205a, 205b and 205c are formed on the same growth substrate 301 through an epitaxial growth, a fabrication cost is reduced, a fabrication process is simplified and a reliability of a product is improved.

FIG. 17 is a schematic cross-section view showing a pixel of a light emitting diode display device according to a first embodiment of the present disclosure.

For convenience of illustration, the first to third emission areas EA1, EA2 and EA3, the first to third transistor areas TrA1, TrA2 and TrA3 and the non-emission area NEA are shown in FIG. 17.

As shown, the single unit pixel P is defined on the substrate 101 to include the first to third emission areas and the non-emission area NEA along the edge of the first emission area EA1. An image is substantially displayed in the first to third emission areas EA1, EA2 and EA3. The first emission area EA1 and the second emission area EA2 are defined to overlap each other, and first emission area EA1 and the third emission area EA3 are defined to overlap each other.

The edge of the first emission area EA1 constitutes the non-emission area NEA.

The first to third transistor areas TrA1, TrA2 and TrA3 are defined in the non-emission area NEA. The first to third transistor areas TrA1, TrA2 and TrA3 are defined by the first to third switching areas STrA1, STrA2 and STrA3 where the first to third switching transistors STW1, STW2 and STW3, the first to third driving areas DTrA1, DTr2 and DTr3 where the first to third driving transistors DRT1, DRT2 and DRT3, and the first to third storage areas StgA1, StgA2 and StgA3 where the first to third storage capacitors Cst1, Cst2 and Cst3.

In the first transistor area TrA1 of the non-emission area NEA on the substrate 101, the first switching gate electrode 103a is disposed to correspond to the first switching area STrA1 and the first driving gate electrode 102a is disposed to correspond to the first driving area DTrA1. A first gate insulating pattern 112a is disposed on the first switching gate electrode 103a and the first driving gate electrode 102a to cover the first switching gate electrode 103a and the first driving gate electrode 102a.

The first switching active layer S-ACT1 is disposed on the first gate insulating pattern 112a corresponding to the first switching area STrA1. The first switching active layer S-ACT1 includes a first switching anti-insulating pattern 105a corresponding to the first switching gate electrode 103a and constituting a channel and first switching source and drain regions 108a and 109a at both sides of the first switching anti-insulating pattern 105a and doped with an impurity of a relatively high concentration.

The first driving active layer D-ACT1 is disposed on the first gate insulating pattern 112a corresponding to the first driving area DTrA1. The first driving active layer D-ACT1 includes a first driving anti-insulating pattern 104a corresponding to the first driving gate electrode 102a and constituting a channel and first driving source and drain regions 106a and 107a at both sides of the first driving anti-insulating pattern 104a and doped with an impurity of a relatively high concentration.

The first interlayer insulating layer 140a is disposed on a whole of the substrate 101 having the first switching active layer S-ACT1 and the first driving active layer D-ACT1. First and second interlayer contact holes 141a and 141b exposing the first driving drain region 107a and the first driving source region 106a, respectively, are formed in the first interlayer insulating layer 140a to correspond to the first driving area DTrA1. Third and fourth interlayer contact holes 141c and 141d exposing the first switching source region 108a and the first switching drain region 109a, respectively, are formed in the first interlayer insulating layer 140a to correspond to the first switching area STrA1.

On the first interlayer insulating layer 140a, the first driving drain electrode 114a electrically connected to the first driving drain region 107a of the first driving active layer D-ACT1 exposed through the first interlayer contact hole 141a is disposed, and the first driving source electrode 115a electrically connected to the first driving source region 106a of the first driving active layer D-ACT1 exposed through the second interlayer contact hole 141b is disposed.

Further, the first switching source electrode 116a electrically connected to the first switching source region 108a of the first switching active layer S-ACT1 exposed through the third interlayer contact hole 141c is disposed, and the first switching drain electrode 117a electrically connected to the first switching drain region 109a of the first switching active layer S-ACT1 exposed through the fourth interlayer contact hole 141d is disposed.

The first switching gate electrode 103a, the first switching active layer S-ACT1, the first switching source electrode 116a and the first switching drain electrode 117a constitute the first switching transistor STW1, and the first driving gate electrode 102a, the first driving active layer D-ACT1, the first driving source electrode 114a and the first driving drain electrode 115a constitute the first driving transistor DRT1.

The first-first storage electrode 121 is disposed in the first storage area StgA1 and is electrically connected to the first driving source electrode 115a through a fifth interlayer contact hole 141e in the first interlayer insulating layer 140a.

The first switching source electrode 116a extends to the first storage area StgA1 to constitute the first-second storage electrode 125, and the first-second storage electrode 125 overlaps the first-first storage electrode 121 with the first dielectric layer 123 interposed therebetween to constitute the first storage capacitor Cst1.

The first driving drain electrode 114a of the first driving area DTrA1 extends to the first emission area EA1 to constitute the first connecting electrode 127.

The second interlayer insulating layer 140b is disposed on a whole of the substrate 101 having the first connecting electrode 127, and the concave portion 143 is disposed in the second interlayer insulating layer 140b to correspond to the first emission area EA1.

The LED 200 is disposed in the concave portion 143.

The LED 200 in the concave portion 143 of the second interlayer insulating layer 140b corresponding to the first emission area EA1 includes the first pad electrode 201a connected to the first connecting electrode 127, the first semiconductor layer 203a, the first active layer 205a and the second semiconductor layer 207 sequentially disposed on the first pad electrode 201a. The second active layer 205b, the third semiconductor layer 203b and the third pad electrode 201b are sequentially disposed on the second semiconductor layer 207 to correspond to the second emission area EA2, and the third active layer 205c, the fourth semiconductor layer 203c and the fourth pad electrode 201c are sequentially disposed on the other portion of the second semiconductor layer 207 to correspond to the third emission area EA3.

The first semiconductor layer 203a, the third semiconductor layer 203b and the fourth semiconductor layer 203c provide a hole to the first to third active layers 205a, 205b and 205c, respectively. The first semiconductor layer 203a, the third semiconductor layer 203b and the fourth semiconductor layer 203c may include a semiconductor material of a positive type gallium nitride (p-GaN) group, and the semiconductor material of a p-GaN group may include gallium nitride (GaN), aluminum gallium nitride (AlGaN), indium gallium nitride (InGaN) or aluminum indium gallium nitride (AlInGaN). Magnesium (Mg), zinc (Zn) or beryllium (Be) may be used as an impurity for doping the first semiconductor layer 203a, the third semiconductor layer 203b and the fourth semiconductor layer 203c.

The first to third active layers 205a, 205b and 205c adjacent to the first semiconductor layer 203a, the third semiconductor layer 203b and the fourth semiconductor layer 203c may have a multi quantum well (MQW) structure including a well layer and a barrier layer having a band gap greater than the well layer.

The first active layer 205a emits a red colored light, the second active layer 205b emits a blue colored light, and the third active layer 205c emits a green colored light.

The first to third active layers 205a, 205b and 205c may have an MQW structure of indium gallium nitride (InGaN)/gallium nitride (GaN), and the first active layer 205a may be doped with europium (Eu).

As a result, the first active layer 205a may include III-V group or II-VI group doped with europium (Eu). For example, the first active layer 205a may include a compound semiconductor material such as gallium nitride (GaN), indium gallium nitride (InGaN), aluminum gallium nitride (AlGaN) and indium aluminum gallium nitride (InAlGaN) doped with europium (Eu).

Europium (Eu) doped to the first active layer 205a has an ion state. As a result, an electron and a hole injected from the first semiconductor layer 203a and the second semiconductor layer 207 are recombined with each other in the first active layer 205a and transitions in europium ($Eu^{3+}$) such that the first active layer 205a emits a red colored light (590 nm to 670 nm).

Each of the second active layer 205b emitting a blue colored light and the third active layer 205c emitting a green colored light may include a compound semiconductor material such as gallium nitride (GaN), indium gallium nitride (InGaN), aluminum gallium nitride (AlGaN) and indium aluminum gallium nitride (InAlGaN) doped with indium (In). The second and third active layers 205b and 205c may have different doping concentrations.

As an indium concentration increases, a wavelength of a light emitted from the second and third active layers 205b and 205c moves from a short wavelength to a long wavelength. As a result, the third active layer 205c having a relatively high indium concentration may emit a green colored light (490 nm to 560 nm), and the second active layer 205b having a relatively low indium concentration may emit a blue colored light (440 nm to 480 nm).

The indium concentration doped to the second and third active layers 205b and 205c may be easily adjusted, and a color purity of blue and green colors may be adjusted by changing the indium concentration.

The second semiconductor layer 207 provides an electron to the first to third active layers 205a, 205b and 205c. The second semiconductor layer 207 may include a semiconductor material of a negative type gallium nitride (n-GaN) group, and the semiconductor material of a negative type gallium nitride (n-GaN) group may include gallium nitride (GaN), aluminum gallium nitride (AlGaN), indium gallium nitride (InGaN) or aluminum indium gallium nitride (AlInGaN). Silicon (Si), germanium (Ge), selenium (Se), tellurium (Te) or carbon (C) may be used as an impurity for doping the second semiconductor layer 207.

The second semiconductor layer 207 on the first active layer 205a is disposed to be exposed over the second interlayer insulating layer 140b, and the second pad electrode 209 is disposed along an edge of the second semiconductor layer 207 on the second interlayer insulating layer 140b.

The second pad electrode 209 contacts a side surface of the second semiconductor layer 207.

Since the second pad electrode 209 does not influence a light emitted from the first active layer 205a, the second pad electrode 209 may be formed of a material having a conductivity as well as a transparent material.

For example, the second pad electrode 209 may include indium tin oxide (ITO), indium zinc oxide (IZO), indium tin zinc oxide (ITZO), zinc oxide (ZnO) or tin oxide (TO) for transmitting a light emitted from the first active layer 205a. Alternatively, the second pad electrode 209 may include silver (Ag), aluminum (Al), gold (Au), chromium (Cr), iridium (Ir), magnesium (Mg), neodymium (Nd), nickel (Ni), palladium (Pd), platinum (Pt), rhodium (Rh), titanium (Ti) or tungsten (W) having a relatively high reflectance, or an alloy of at least two thereof, or a laminated structure of different metals.

The insulating layer 211 is disposed along an edge of the first semiconductor layer 203a, the first active layer 205a and the first pad electrode 201a to insulate the first pad electrode 201a, the first active layer 205a and the first semiconductor layer 203a from the second pad electrode 209.

The data line DL and the common line Vcom are disposed on the second interlayer insulating layer 140b, and the data line DL is electrically connected to the first switching drain electrode 117a through the sixth interlayer contact hole 141f in the second interlayer insulating layer 140b.

The second pad electrode 209 is electrically connected to the common line Vcom on the second interlayer insulating layer 140b.

As a result, the first active layer 205a receives the power voltage from the first driving transistor DRT1 connected to the first pad electrode 201a and the common voltage through the second pad electrode 209 connected to the common line Vcom to emit a light.

The third interlayer insulating layer 140c is disposed on a whole of the substrate 101 having the LED 200, the common line Vcom and the data line DL corresponding to the first emission area EA1, and the second transistor area TrA2 is defined on the third interlayer insulating layer 140c at one side of the non-emission area NEA.

In the second transistor area TrA2, the second switching gate electrode 103b is disposed to correspond to the second switching area STrA2, and the second driving gate electrode 102b is disposed to correspond to the second driving area DTrA2.

A second gate insulating pattern 112b is disposed on the second switching gate electrode 103b and the second driving gate electrode 102b to cover the second switching gate electrode 103b and the second driving gate electrode 102b.

The second switching active layer S-ACT2 is disposed on the second gate insulating pattern 112b corresponding to the second switching area STrA2. The second switching active layer S-ACT2 includes a second switching anti-insulating pattern 105b corresponding to the second switching gate electrode 103b and constituting a channel and second switching source and drain regions 108b and 109b at both sides of the second switching anti-insulating pattern 105b and doped with an impurity of a relatively high concentration.

The second driving active layer D-ACT2 is disposed on the second gate insulating pattern 112b corresponding to the second driving area DTrA2. The second driving active layer D-ACT2 includes a second driving anti-insulating pattern 104b corresponding to the second driving gate electrode 102b and constituting a channel and second driving source and drain regions 106b and 107b at both sides of the second driving anti-insulating pattern 104b and doped with an impurity of a relatively high concentration.

The third transistor area TrA3 is defined on the third interlayer insulating layer 140c at the other side of the non-emission area NEA. In the third transistor area TrA3, the third switching gate electrode 103c is disposed to correspond to the third switching area STrA3, and the third driving gate electrode 102c is disposed to correspond to the third driving area DTrA3.

A third gate insulating pattern 112c is disposed on the third switching gate electrode 103c and the third driving gate electrode 102c to cover the third switching gate electrode 103c and the third driving gate electrode 102c.

The third switching active layer S-ACT3 is disposed on the third gate insulating pattern 112c corresponding to the third switching area STrA3. The third switching active layer S-ACT3 includes a third switching anti-insulating pattern 105c corresponding to the third switching gate electrode 103c and constituting a channel and third switching source and drain regions 108c and 109c at both sides of the third switching anti-insulating pattern 105c and doped with an impurity of a relatively high concentration.

The third driving active layer D-ACT3 is disposed on the third gate insulating pattern 112c corresponding to the third driving area DTrA3. The third driving active layer D-ACT3 includes a third driving anti-insulating pattern 104c corresponding to the third driving gate electrode 102c and constituting a channel and third driving source and drain regions 106c and 107c at both sides of the third driving anti-insulating pattern 104c and doped with an impurity of a relatively high concentration.

The fourth interlayer insulating layer 140d is disposed on a whole of the substrate 101 having the second and third switching active layers S-ACT2 and S-ACT3 and the second and third driving active layers D-ACT2 and D-ACT3. Seventh and eighth interlayer contact holes 141g and 141h exposing the second driving drain region 107b and the second driving source region 106b, respectively, are formed in the fourth interlayer insulating layer 140d to correspond to the second driving area DTrA2. Ninth and tenth interlayer contact holes 141i and 141j exposing the second switching source region 108b and the second switching drain region 109b, respectively, are formed in the fourth interlayer insulating layer 140d to correspond to the second switching area STrA2.

Thirteenth and fourteenth interlayer contact holes 141m and 141n exposing the third driving drain region 107c and the third driving source region 106c, respectively, are formed in the fourth interlayer insulating layer 140d to correspond to the third driving area DTrA3. Fifteenth and sixteenth interlayer contact holes 141o and 141p exposing the third switching source region 108c and the third switching drain region 109c, respectively, are formed in the fourth interlayer insulating layer 140d to correspond to the third switching area STrA3.

In addition, the fourth interlayer insulating layer 140d has eleventh interlayer contact hole 141k exposing the third pad electrode 201b and twelfth interlayer contact hole 141q exposing the fourth pad electrode 201c with the third interlayer insulating layer 140c.

The fourth interlayer insulating layer 140d has seventeenth and eighteenth interlayer contact holes 141r and 141s exposing the data line DL with the third interlayer insulating layer 140c.

On the fourth interlayer insulating layer 140d, the second driving drain electrode 114b electrically connected to the second driving drain region 107b of the second driving active layer D-ACT2 exposed through the seventh interlayer contact hole 141g is disposed, and the second driving source electrode 115b electrically connected to the second driving source region 106b of the second driving active layer D-ACT2 exposed through the eighth interlayer contact hole 141h is disposed.

Further, the second switching source electrode 116b electrically connected to the second switching source region 108b of the second switching active layer S-ACT2 exposed through the ninth interlayer contact hole 141i is disposed, and the second switching drain electrode 117b electrically connected to the second switching drain region 109b of the second switching active layer S-ACT2 exposed through the tenth interlayer contact hole 141j is disposed.

On the fourth interlayer insulating layer 140d, the third driving drain electrode 114c electrically connected to the third driving drain region 107c of the third driving active layer D-ACT3 exposed through the thirteenth interlayer contact hole 141m is disposed, and the third driving source electrode 115c electrically connected to the third driving source region 106c of the third driving active layer D-ACT3 exposed through the fourteenth interlayer contact hole 141n is disposed.

Further, the third switching source electrode 116c electrically connected to the third switching source region 108c of the third switching active layer S-ACT3 exposed through the fifteenth interlayer contact hole 141o is disposed, and the third switching drain electrode 117c electrically connected to the third switching drain region 109c of the third switching active layer S-ACT3 exposed through the sixteenth interlayer contact hole 141p is disposed.

The second driving drain electrode 114b is electrically connected to the third pad electrode 201b through the eleventh interlayer contact hole 141k, and the third driving drain electrode 114c is electrically connected to the fourth pad electrode 201c through the twelfth interlayer contact hole 141l.

The third switching drain electrode 117c is electrically connected to the data line DL through the seventeenth interlayer contact hole 141q, and the second switching drain electrode 117b is electrically connected to the data line DL through the eighteenth interlayer contact hole 141r.

As a result, the second active layer 205b receives the common voltage through the second pad electrode 209 connected to the common line Vcom and the power voltage from the second driving transistor DRT2 through the third pad electrode 201b to emit a light. The third active layer 205c receives the common voltage through the second pad electrode 209 connected to the common line Vcom and the power voltage from the third driving transistor DRT3 through the fourth pad electrode 201c to emit a light.

The second switching gate electrode 103b, the second switching active layer S-ACT2, the second switching source electrode 116b and the second switching drain electrode 117b constitute the second switching transistor STW2, and the second driving gate electrode 102b, the second driving active layer D-ACT2, the second driving source electrode 115b and the second driving drain electrode 114b constitute the second driving transistor DRT2. The third switching gate electrode 103c, the third switching active layer S-ACT3, the third switching source electrode 116c and the third switching drain electrode 117c constitute the third switching transistor STW3, and the third driving gate electrode 102c, the third driving active layer D-ACT3, the third driving source electrode 114c and the third driving drain electrode 115c constitute the third driving transistor DRT3.

The second-first storage electrode 121b is disposed in the second storage area StgA2 and is electrically connected to the second driving source electrode 115b through a nineteenth interlayer contact hole 141s in the fourth interlayer insulating layer 140b. The second switching source electrode 116b extends to the second storage area StgA2 to constitute the second-second storage electrode 125b, and the second-second storage electrode 125b overlaps the second-first storage electrode 121b with the second dielectric layer 123b interposed therebetween to constitute the second storage capacitor Cst2.

The third-first storage electrode 121c electrically connected to the third driving source electrode 115c through the twentieth interlayer contact hole 141t of the fourth interlayer insulating layer 140d is disposed in the third storage area StgA3, and the third switching source electrode 116c extends to the third storage area StgA3 to constitute the third-second storage electrode 125c. The third-first and third-second storage electrodes 121c and 125c overlap each other with the third dielectric layer 123c interposed therebetween to constitute the third storage capacitor Cst3.

The fifth interlayer insulating layer 140e is disposed on the fourth interlayer insulating layer 140d, the second and third switching source and drain electrodes 116b, 117b, 116c and 117c, the second-second storage electrode 125b and the third-second storage electrode 125c.

The fifth interlayer insulating layer 140e protects the LED 200 and the first to third driving and switching transistors DRT1, DRT2, DRT3, STW1, STW2 and STW3 and prevents exterior oxygen and moisture from penetrating the LED display device 100.

Second Embodiment

FIG. 18 is a schematic cross-sectional view showing a pixel of a light emitting diode display device according to a second embodiment of the present disclosure, and FIG. 19 is a schematic circuit diagram showing a circuit structure of a light emitting diode display device according to a second embodiment of the present disclosure.

To avoid duplicated illustration, a part which has the same function as the first embodiment will be represented by the same reference number, and a characteristic part of the second embodiment will be illustrated.

For convenience of illustration, first to third emission areas EA1, EA2 and EA3, first to third transistor areas TrA1, TrA2 and TrA3 and a non-emission area NEA are shown in FIG. 18.

As shown, in the first transistor area TrA1 of the non-emission area NEA on a substrate 101, a first switching gate electrode 103a is disposed to correspond to a first switching area STrA1 and a first driving gate electrode 102a is disposed to correspond to a first driving area DTrA1. A first gate insulating pattern 112a is disposed on the first switching gate electrode 103a and the first driving gate electrode 102a to cover the first switching gate electrode 103a and the first driving gate electrode 102a.

A first switching active layer S-ACT1 is disposed on the first gate insulating pattern 112a corresponding to a first switching area STrA1. The first switching active layer S-ACT1 includes a first switching anti-insulating pattern 105a corresponding to the first switching gate electrode 103a and constituting a channel and first switching source and drain regions 108a and 109a at both sides of the first switching anti-insulating pattern 105a and doped with an impurity of a relatively high concentration.

A first driving active layer D-ACT1 is disposed on the first gate insulating pattern 112a corresponding to a first driving area DTrA1. The first driving active layer D-ACT1 includes a first driving anti-insulating pattern 104a corresponding to the first driving gate electrode 102a and constituting a channel and first driving source and drain regions 106a and 107a at both sides of the first driving anti-insulating pattern 104a and doped with an impurity of a relatively high concentration.

A first interlayer insulating layer 140a is disposed on a whole of the substrate 101 having the first switching active layer S-ACT1 and the first driving active layer D-ACT1. First and second interlayer contact holes 141a and 141b exposing the first driving drain region 107a and the first driving source region 106a, respectively, are formed in the first interlayer insulating layer 140a to correspond to the first driving area DTrA1. Third and fourth interlayer contact holes 141c and 141d exposing the first switching drain region 109a and the first switching source region 108a, respectively, are formed in the first interlayer insulating layer 140a to correspond to the first switching area STrA1.

On the first interlayer insulating layer 140a, a first driving drain electrode 114a electrically connected to the first driving drain region 107a of the first driving active layer D-ACT1 exposed through the first interlayer contact hole 141a is disposed, and a first driving source electrode 115a electrically connected to the first driving source region 106a of the first driving active layer D-ACT1 exposed through the second interlayer contact hole 141b is disposed.

Further, a first switching drain electrode 117a electrically connected to the first switching drain region 109a of the first switching active layer S-ACT1 exposed through the third interlayer contact hole 141c is disposed, and a first switching source electrode 116a electrically connected to the first switching source region 108a of the first switching active layer S-ACT1 exposed through the fourth interlayer contact hole 141d is disposed.

The first switching gate electrode 103a, the first switching active layer S-ACT1, the first switching source electrode 116a and the first switching drain electrode 117a constitute the first switching transistor STW1, and the first driving gate electrode 102a, the first driving active layer D-ACT1, the first driving source electrode 114a and the first driving drain electrode 115a constitute the first driving transistor DRT1.

The first driving drain electrode 114a of the first driving area DTrA1 extends to a first emission area EA1 to constitute a first connecting electrode 127.

A second interlayer insulating layer 140b is disposed on a whole of the substrate 101 having the first connecting electrode 127, and a concave portion 143 is disposed in the second interlayer insulating layer 140b to correspond to the first emission area EA1.

A light emitting diode (LED) 200 is disposed in the concave portion 143.

The LED 200 in the concave portion 143 of the second interlayer insulating layer 140b corresponding to the first emission area EA1 includes a first pad electrode 201a connected to the first connecting electrode 127 and a first semiconductor layer 207a, a first active layer 205a and a second semiconductor layer 203 sequentially disposed on the first pad electrode 201a. A second active layer 205b, a third semiconductor layer 207b and a third pad electrode 201b are sequentially disposed on the second semiconductor layer 203 to correspond to a second emission area EA2, and a third active layer 205c, a fourth semiconductor layer 207c and a fourth pad electrode 201c are sequentially disposed on the second semiconductor layer 203 to correspond to a third emission area EA3.

The first semiconductor layer 207a, the third semiconductor layer 207b and the fourth semiconductor layer 207c provide an electron to the first to third active layers 205a, 205b and 205c, respectively. The first semiconductor layer 207a, the third semiconductor layer 207b and the fourth semiconductor layer 207c may include a semiconductor material of a negative type gallium nitride (n-GaN) group, and the semiconductor material of an n-GaN group may include gallium nitride (GaN), aluminum gallium nitride (AlGaN), indium gallium nitride (InGaN) or aluminum indium gallium nitride (AlInGaN). Silicon (Si), germanium (Ge), selenium (Se), tellurium (Te) or carbon (C) may be used as an impurity for doping the first semiconductor layer 207a, the third semiconductor layer 207b and the fourth semiconductor layer 207c.

The first to third active layers 205a, 205b and 205c adjacent to the first semiconductor layer 207a, the third semiconductor layer 207b and the fourth semiconductor layer 207c may have a multi quantum well (MQW) structure including a well layer and a barrier layer having a band gap greater than the well layer.

The first active layer 205a emits a red colored light, the second active layer 205b emits a blue colored light, and the third active layer 205c emits a green colored light.

The first to third active layers 205a, 205b and 205c may have an MQW structure of indium gallium nitride (InGaN)/gallium nitride (GaN), and the first active layer 205a may be doped with europium (Eu).

As a result, the first active layer 205a may include III-V group or II-VI group doped with europium (Eu). For example, the first active layer 205a may include a compound semiconductor material such as gallium nitride (GaN), indium gallium nitride (InGaN), aluminum gallium nitride (AlGaN) and indium aluminum gallium nitride (InAlGaN) doped with europium (Eu).

Europium (Eu) doped to the first active layer 205a has an ion state. As a result, an electron and a hole injected from the first semiconductor layer 207a and the second semiconductor layer 203 are recombined with each other in the first active layer 205a and transitions in europium ($Eu^{3+}$) such that the first active layer 205a emits a red colored light (590 nm to 670 nm).

Each of the second active layer 205b emitting a blue colored light and the third active layer 205c emitting a green colored light may include a compound semiconductor material such as gallium nitride (GaN), indium gallium nitride (InGaN), aluminum gallium nitride (AlGaN) and indium aluminum gallium nitride (InAlGaN) doped with indium (In). The second and third active layers 205b and 205c may have different doping concentrations.

As an indium concentration increases, a wavelength of a light emitted from the second and third active layers 205b and 205c moves from a short wavelength to a long wavelength. As a result, the third active layer 205c having a relatively high indium concentration may emit a green colored light (490 nm to 560 nm), and the second active layer 205b having a relatively low indium concentration may emit a blue colored light (440 nm to 480 nm).

The indium concentration doped to the second and third active layers 205b and 205c may be easily adjusted, and a color purity of blue and green colors may be adjusted by changing the indium concentration.

The second semiconductor layer 203 provides a hole to the first to third active layers 205a, 205b and 205c. The second semiconductor layer 203 may include a semiconductor material of a positive type gallium nitride (p-GaN) group, and the semiconductor material of a positive type gallium nitride (p-GaN) group may include gallium nitride (GaN), aluminum gallium nitride (AlGaN), indium gallium nitride (InGaN) or aluminum indium gallium nitride (AlInGaN). Magnesium (Mg), zinc (Zn) or beryllium (Be) may be used as an impurity for doping the second semiconductor layer 203.

The second semiconductor layer 203 on the first active layer 205a is disposed to be exposed over the second interlayer insulating layer 140b, and the second pad electrode 209 is disposed along an edge of the second semiconductor layer 203 on the second interlayer insulating layer 140b.

The second pad electrode 209 contacts a side surface of the second semiconductor layer 203.

An insulating layer 211 is disposed along an edge of the first semiconductor layer 207a, the first active layer 205a and the first pad electrode 201a to insulate the first pad electrode 201a, the first active layer 205a and the first semiconductor layer 207a from the second pad electrode 209.

A data line DL and a common line Vcom are disposed on the second interlayer insulating layer 140b, and the data line DL is electrically connected to the first switching source electrode 116a through a sixth interlayer contact hole 141f in the second interlayer insulating layer 140b.

The second pad electrode 209 is electrically connected to the common line Vcom on the second interlayer insulating layer 140b.

A sixth interlayer contact hole 141f exposing the first switching drain electrode 117a is formed in the second interlayer insulating layer 140b, and a first-second storage electrode 125a connected to the first switching drain electrode 117a through the sixth interlayer contact hole 141f is disposed on the second interlayer insulating layer 140b to correspond to the first storage area StgA1.

The first driving source electrode 115a extends to the first storage area StgA1 to constitute a first-first storage electrode 121a, and the first-first storage electrode 121a overlaps a first-second storage electrode 125a with a first dielectric layer 123a interposed therebetween to constitute a first storage capacitor Cst1.

A third interlayer insulating layer 140c is disposed on a whole of the substrate 101 having the LED 200, a source line Vdd and the data line DL corresponding to the first emission area EA1, and a second transistor area TrA2 is defined on the third interlayer insulating layer 140c at one side of the non-emission area NEA.

In the second transistor area TrA2, a second switching gate electrode 103b is disposed to correspond to a second switching area STrA2, and a second driving gate electrode 102b is disposed to correspond to a second driving area DTrA2.

A second gate insulating pattern 112b is disposed on the second switching gate electrode 103b and the second driving gate electrode 102b to cover the second switching gate electrode 103b and the second driving gate electrode 102b.

A second switching active layer S-ACT2 is disposed on the second gate insulating pattern 112b corresponding to the second switching area STrA2. The second switching active layer S-ACT2 includes a second switching anti-insulating pattern 105b corresponding to the second switching gate electrode 103b and constituting a channel and second switching source and drain regions 108b and 109b at both sides of the second switching anti-insulating pattern 105b and doped with an impurity of a relatively high concentration.

A second driving active layer D-ACT2 is disposed on the second gate insulating pattern 112b corresponding to the second driving area DTrA2. The second driving active layer D-ACT2 includes a second driving anti-insulating pattern 104b corresponding to the second driving gate electrode 102b and constituting a channel and second driving source and drain regions 106b and 107b at both sides of the second driving anti-insulating pattern 104b and doped with an impurity of a relatively high concentration.

The third transistor area TrA3 is defined on the third interlayer insulating layer 140c at the other side of the non-emission area NEA. In the third transistor area TrA3, a third switching gate electrode 103c is disposed to correspond to a third switching area STrA3, and a third driving gate electrode 102c is disposed to correspond to a third driving area DTrA3.

A third gate insulating pattern 112c is disposed on the third switching gate electrode 103c and the third driving gate electrode 102c to cover the third switching gate electrode 103c and the third driving gate electrode 102c.

A third switching active layer S-ACT3 is disposed on the third gate insulating pattern 112c corresponding to the third switching area STrA3. The third switching active layer S-ACT3 includes a third switching anti-insulating pattern 105c corresponding to the third switching gate electrode 103c and constituting a channel and third switching source and drain regions 108c and 109c at both sides of the third switching anti-insulating pattern 105c and doped with an impurity of a relatively high concentration.

A third driving active layer D-ACT3 is disposed on the third gate insulating pattern 112c corresponding to the third driving area DTrA3. The third driving active layer D-ACT3 includes a third driving anti-insulating pattern 104c corresponding to the third driving gate electrode 102c and constituting a channel and third driving source and drain regions 106c and 107c at both sides of the third driving anti-insulating pattern 104c and doped with an impurity of a relatively high concentration.

A fourth interlayer insulating layer 140d is disposed on a whole of the substrate 101 having the second and third switching active layers S-ACT2 and S-ACT3 and the second and third driving active layers D-ACT2 and D-ACT3. Seventh and eighth interlayer contact holes 141g and 141h exposing the second driving drain region 107b and the second driving source region 106b, respectively, are formed in the fourth interlayer insulating layer 140d to correspond to the second driving area DTrA2. Ninth and tenth interlayer contact holes 141i and 141j exposing the second switching drain region 109b and the second switching source region 108b, respectively, are formed in the fourth interlayer insulating layer 140d to correspond to the second switching area STrA2.

Thirteenth and fourteenth interlayer contact holes 141m and 141n exposing the third driving drain region 107c and the third driving source region 106c, respectively, are formed in the fourth interlayer insulating layer 140d to correspond to the third driving area DTrA3. Fifteenth and sixteenth interlayer contact holes 141o and 141p exposing the third switching drain region 109c and the third switching source region 108c, respectively, are formed in the fourth interlayer insulating layer 140d to correspond to the third switching area STrA3.

In addition, the fourth interlayer insulating layer 140d has eleventh interlayer contact hole 141k exposing the third pad electrode 201b and twelfth interlayer contact hole 141l exposing the fourth pad electrode 201c with the third interlayer insulating layer 140c.

The fourth interlayer insulating layer 140d has seventeenth and eighteenth interlayer contact holes 141r and 141s exposing the data line DL with the third interlayer insulating layer 140c.

On the fourth interlayer insulating layer 140d, a second driving drain electrode 114b electrically connected to the second driving drain region 107b of the second driving active layer D-ACT2 exposed through the seventh interlayer contact hole 141g is disposed, and a second driving source electrode 115b electrically connected to the second driving source region 106b of the second driving active layer D-ACT2 exposed through the eighth interlayer contact hole 141h is disposed.

Further, a second switching drain electrode 117b electrically connected to the second switching drain region 109b of the second switching active layer S-ACT2 exposed through the ninth interlayer contact hole 141i is disposed, and a second switching source electrode 116b electrically connected to the second switching source region 108b of the second switching active layer S-ACT2 exposed through the tenth interlayer contact hole 141j is disposed.

On the fourth interlayer insulating layer 140d, a third driving drain electrode 114c electrically connected to the third driving drain region 107c of the third driving active layer D-ACT3 exposed through the thirteenth interlayer contact hole 141m is disposed, and a third driving source electrode 115c electrically connected to the third driving source region 106c of the third driving active layer D-ACT3 exposed through the fourteenth interlayer contact hole 141n is disposed.

Further, a third switching drain electrode 117c electrically connected to the third switching drain region 109c of the third switching active layer S-ACT3 exposed through the fifteenth interlayer contact hole 141o is disposed, and a third switching source electrode 116c electrically connected to the third switching source region 108c of the third switching active layer S-ACT3 exposed through the sixteenth interlayer contact hole 141p is disposed.

The second driving drain electrode 114b is electrically connected to the third pad electrode 201b through the eleventh interlayer contact hole 141k, and the third driving drain electrode 114c is electrically connected to the fourth pad electrode 201c through the twelfth interlayer contact hole 141l.

The third switching source electrode 116c is electrically connected to the data line DL through the seventeenth interlayer contact hole 141q, and the second switching source electrode 116b is electrically connected to the data line DL through the eighteenth interlayer contact hole 141r.

The second switching gate electrode 103b, the second switching active layer S-ACT2, the second switching source electrode 116b and the second switching drain electrode 117b constitute the second switching transistor STW2, and the second driving gate electrode 102b, the second driving active layer D-ACT2, the second driving source electrode 115b and the second driving drain electrode 114b constitute the second driving transistor DRT2. The third switching gate electrode 103c, the third switching active layer S-ACT3, the third switching source electrode 116c and the third switching drain electrode 117c constitute the third switching transistor STW3, and the third driving gate electrode 102c, the third driving active layer D-ACT3, the third driving source electrode 114c and the third driving drain electrode 115c constitute the third driving transistor DRT3.

A second-first storage electrode 121b is disposed in the second storage area StgA2 and is electrically connected to the second driving source electrode 115b through a nineteenth interlayer contact hole 141s in the fourth interlayer insulating layer 140b. The second switching drain electrode 117b extends to the second storage area StgA2 to constitute a second-second storage electrode 125b, and the second-second storage electrode 125b overlaps the second-first storage electrode 121b with a second dielectric layer 123b interposed therebetween to constitute a second storage capacitor Cst2.

A third-first storage electrode 121c electrically connected to the third driving source electrode 115c through the twentieth interlayer contact hole 141t of the fourth interlayer insulating layer 140d is disposed in the third storage area StgA3, and the third switching drain electrode 117c extends to the third storage area StgA3 to constitute a third-second storage electrode 125c. The third-first and third-second storage electrodes 121c and 125c overlap each other with a third dielectric layer 123c interposed therebetween to constitute a third storage capacitor Cst3.

A fifth interlayer insulating layer 140e is disposed on the fourth interlayer insulating layer 140d, the second and third driving source and drain electrodes 114b, 115b, 114c and 115c, the second-second storage electrode 125b and the third-second storage electrode 125c.

The fifth interlayer insulating layer 140e protects the LED 200 and the first to third driving and switching transistors DRT1, DRT2, DRT3, STW1, STW2 and STW3 and prevents exterior oxygen and moisture from penetrating the LED display device 100.

In the LED display device 100 according to a second embodiment of the present disclosure, the first emission area EA1 and the second emission area EA2 overlap each other, and the first emission area EA1 and the third emission area EA3 overlap each other. The LED 200 including the first active layer 205a is disposed to correspond to the first emission area EA1, only the second active layer 205b of the LED 200 is disposed to correspond to the second emission area EA2, and only the third active layer 205c of the LED 200 is disposed to correspond to the third emission area EA3. The first switching and driving transistors STW1 and DRT1 for driving the first active layer 205a are disposed in the first transistor area TrA1, the second switching and driving transistors STW2 and DRT2 for driving the second active layer 205b are disposed in the second transistor area TrA2, and the third switching and driving transistors STW3 and DRT3 for driving the third active layer 205c are disposed in the third transistor area TrA3.

Since all of red, green and blue colors are obtained in the single pixel P due to the first to third active layers 205a, 205b and 205c, a size of the pixel is reduced as compared with the LED display device according to a comparison example.

Since a density of a pixel P per unit area increases, a high resolution greater than 300 ppi (pixel per inch) and an ultra-high resolution greater than 500 ppi are obtained.

In addition, since areas of the first to third active layers 205a, 205b and 205c are enlarged, an emission efficiency of each of the active layers 205a, 205b and 205c is improved, and an image of a relatively high luminance is obtained.

Further, since a transferring process of the LED 200 is omitted, a fabrication time and a fabrication cost are reduced and a fabrication efficiency is improved. Since the first to third active layers 205a, 205b and 205c are formed on the same growth substrate 301 (of FIG. 12) through an epitaxial growth, a fabrication cost is reduced, a fabrication process is simplified and a reliability of a product is improved.

While the present disclosure has been described with reference to exemplary embodiments and examples, these embodiments and examples are not intended to limit the scope of the present disclosure. Rather, it will be apparent to those skilled in the art that various modifications and variations can be made in the present disclosure without departing from the spirit or scope of the invention. Thus, it is intended that the present disclosure cover the modifications and variations of the present disclosure provided they come within the scope of the appended claims and their equivalents. The various embodiments described above can be combined to provide further embodiments. Aspects of the embodiments can be modified, if necessary to employ concepts of the various patents, applications and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting diode (LED) display device, comprising:
   a substrate;
   an LED including a first semiconductor layer, a first active layer and a second semiconductor layer sequentially disposed and corresponding to a first emission area, a second active layer on the second semiconductor layer and corresponding to a second emission area overlapping a portion of the first emission area, a third semiconductor layer on the second active layer, a third active layer on the second semiconductor layer and corresponding to a third emission area overlapping another portion of the first emission area and a fourth semiconductor layer on the third active layer;
   a first transistor on a portion of the substrate for driving the first active layer;
   a second transistor on another portion of the substrate for driving the second active layer; and
   a third transistor on the first transistor over the portion of the substrate for driving the third active layer.

2. The LED display device according to claim 1, wherein a first pad electrode is disposed under the first semiconductor layer, and third and fourth pad electrodes are disposed on the third and fourth semiconductor layers, respectively, and
   wherein a second pad electrode is disposed along an edge of the second semiconductor layer and contacts a side surface of the second semiconductor layer.

3. The LED display device according to claim 2, wherein an insulating layer is disposed along an edge of the first pad electrode, the first semiconductor layer and the first active layer.

4. The LED display device according to claim 1, wherein the first semiconductor layer, the third semiconductor layer and the fourth semiconductor layer include a semiconductor material of a negative type gallium nitride (n-GaN) group, and the second semiconductor layer includes a semiconductor material of a positive type gallium nitride (p-GaN) group.

5. The LED display device according to claim 1, wherein the first semiconductor layer, the third semiconductor layer and the fourth semiconductor layer include a semiconductor material of a positive type gallium nitride (p-GaN) group, and the second semiconductor layer includes a semiconductor material of a negative type gallium nitride (n-GaN) group.

6. The LED display device according to claim 1, wherein the first active layer is doped with europium (Eu).

7. The LED display device according to claim 2, wherein the first pad electrode is electrically connected to a first driving drain electrode of a first driving transistor of the first transistor,
   wherein the second pad electrode is electrically connected to a common line,
   wherein the third pad electrode is electrically connected to a second driving drain electrode of a second driving transistor of the second transistor, and
   wherein the fourth pad electrode is electrically connected to a third driving drain electrode of a third driving transistor of the third transistor.

8. The LED display device according to claim 7, wherein first to third driving gate electrodes of the first to third driving transistors are electrically connected to first to third switching source electrodes of first to third switching transistors, respectively,
   wherein the first to third switching gate electrodes of the first to third switching transistors are electrically connected to a gate line,
   wherein first to third driving source electrodes of the first to third driving transistors are electrically connected to a power line, and
   wherein first to third switching source electrodes of the first to third switching transistors are electrically connected to a data line.

9. The LED display device according to claim 2, wherein the first pad electrode is electrically connected to a first driving drain electrode of a first driving transistor of the first transistor,
   wherein the second pad electrode is electrically connected to a power line,
   wherein the third pad electrode is electrically connected to a second driving drain electrode of a second driving transistor of the second transistor, and
   wherein the fourth pad electrode is electrically connected to a third driving drain electrode of a third driving transistor of the third transistor.

10. The LED display device according to claim 9, wherein first to third driving gate electrodes of the first to third driving transistors are electrically connected to first to third switching drain electrodes of first to third switching transistors, respectively,
    wherein the first to third switching gate electrodes of the first to third switching transistors are electrically connected to a gate line,
    wherein first to third driving source electrodes of the first to third driving transistors are electrically connected to a common line, and
    wherein first to third switching source electrodes of the first to third switching transistors electrically connected to a data line.

11. The LED display device according to claim 10, wherein the first to third driving transistors include the first to third driving gate electrodes, first to third driving anti-insulating patterns, first to third driving active layers having first to third driving source and drain regions, and first to third driving source and drain electrodes, and wherein the first to third switching transistors include the first to third switching gate electrodes, first to third switching anti-insulating patterns, first to third switching active layers having first to third switching source and drain regions, and first to third switching source and drain electrodes.

12. A method of fabricating a light emitting diode (LED) display device, the method comprising:

a) sequentially forming an undoped semiconductor layer, a first semiconductor material layer, an active material layer and a second semiconductor material layer on a growth substrate;

b) forming a first insulating layer having a first concave portion on the second semiconductor material layer;

c) sequentially forming a second active layer and a third semiconductor layer in the first concave portion on the second semiconductor material layer;

d) after forming a second concave portion in the first insulating layer, sequentially forming a second active layer and a third semiconductor layer in the second concave portion on the second semiconductor material layer;

e) forming a first semiconductor layer, a first active layer and a second semiconductor layer by patterning the first semiconductor material layer, the active material layer and the second semiconductor material layer;

f) forming an insulating layer along an edge of the first semiconductor layer and the first active layer;

g) forming a second pad electrode along an edge of the second semiconductor layer, a third pad electrode on the third semiconductor layer, and a fourth pad electrode on the fourth semiconductor layer over the insulating layer;

h) removing the growth substrate and the undoped semiconductor layer; and i) forming a first pad electrode under the first semiconductor layer.

13. The method according to claim 12, wherein the step (d) comprises forming a second insulating layer on the third semiconductor layer.

14. The method according to claim 12, further comprising, before the step (c), removing the first insulating layer.

15. The LED display device according to claim 8, wherein the first to third driving transistors include the first to third driving gate electrodes, first to third driving anti-insulating patterns, first to third driving active layers having first to third driving source and drain regions, and first to third driving source and drain electrodes, and wherein the first to third switching transistors include the first to third switching gate electrodes, first to third switching anti-insulating patterns, first to third switching active layers having first to third switching source and drain regions, and first to third switching source and drain electrodes.

\* \* \* \* \*